US009177095B1

(12) United States Patent
Krishnan et al.

(10) Patent No.: US 9,177,095 B1
(45) Date of Patent: Nov. 3, 2015

(54) METHODS, SYSTEMS, AND ARTICLES OF MANUFACTURE FOR CREATING OR MANIPULATING ELECTRICAL DATA SETS FOR AN ELECTRONIC DESIGN

(75) Inventors: Prakash Krishnan, Wayne, NJ (US); Wilfred Vance Kenzle, San Jose, CA (US); Akshat Shah, Philadelphia, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 216 days.

(21) Appl. No.: 13/282,177

(22) Filed: Oct. 26, 2011

(51) Int. Cl.
*G06G 7/62* (2006.01)
*G06F 17/50* (2006.01)

(52) U.S. Cl.
CPC ........ *G06F 17/5081* (2013.01); *G06F 17/5068* (2013.01)

(58) Field of Classification Search
CPC ............ G06F 17/5045; G06F 17/5031; G06F 17/5081; G06F 17/5068; G06F 17/5022; G06Q 50/184
See application file for complete search history.

(56) References Cited

U.S. PATENT DOCUMENTS

| | | | |
|---|---|---|---|
| 5,544,067 A * | 8/1996 | Rostoker et al. | 703/14 |
| 5,867,399 A * | 2/1999 | Rostoker et al. | 716/102 |
| 6,360,350 B1 | 3/2002 | Gabele et al. | |
| 7,392,255 B1 * | 6/2008 | Sholtis et al. | 1/1 |
| 7,587,694 B1 | 9/2009 | Henrickson et al. | |
| 7,792,933 B2 * | 9/2010 | Butts et al. | 709/222 |
| 7,827,518 B2 * | 11/2010 | Wu et al. | 716/53 |
| 7,949,987 B1 * | 5/2011 | Ginetti et al. | 716/139 |
| 8,028,243 B1 * | 9/2011 | O'Riordan | 715/765 |
| 8,195,852 B2 * | 6/2012 | Tantos et al. | 710/72 |
| 8,265,918 B1 * | 9/2012 | Neema et al. | 703/14 |
| 8,543,372 B1 * | 9/2013 | Fernandez et al. | 703/26 |
| 2004/0261058 A1 * | 12/2004 | Kundert | 717/119 |
| 2006/0123377 A1 * | 6/2006 | Schultz et al. | 716/11 |
| 2008/0120085 A1 * | 5/2008 | Alexanian et al. | 703/14 |
| 2010/0049495 A1 * | 2/2010 | Francken et al. | 703/14 |
| 2010/0050138 A1 | 2/2010 | Chidambarrao et al. | |

(Continued)

OTHER PUBLICATIONS

Pimentel et al. ("A Systematic Approach to Exploring Embedded System Architectures at Multiple Abstraction Levels", IEEE, 2006, pp. 99-112).*

(Continued)

*Primary Examiner* — Omar Fernandez Rivas
*Assistant Examiner* — Iftekhar Khan
(74) *Attorney, Agent, or Firm* — Vista IP Law Group, LLP

(57) ABSTRACT

Disclosed are method(s), system(s), and article(s) of manufacture for creating or manipulating electrical data sets for an electronic design across multiple abstraction levels. The method identifies simulation result(s) obtained from simulation run(s) for an electronic circuit or at least a portion thereof, identifies at least a part of one or more sets of simulation results, each of which is obtained from a simulation run for the electronic circuit or at least a portion thereof at the first abstraction level, identify relevant electrical data or information for design under test instance(s) of a master library or a master cell and creates electrical data set(s), generates a view for at least some of the electrical data set(s), and hand-off the electrical data set(s) to second abstraction level. The method may further identify preexisting electrical data set(s). The method may further compare the electrical data set(s) and preexisting electrical data set(s).

38 Claims, 25 Drawing Sheets

(56) References Cited

U.S. PATENT DOCUMENTS

| | | | |
|---|---|---|---|
| 2010/0083200 A1* | 4/2010 | Song et al. | 716/5 |
| 2011/0107293 A1* | 5/2011 | Ganzhorn et al. | 716/139 |
| 2011/0307854 A1* | 12/2011 | Lu et al. | 716/119 |
| 2012/0023472 A1* | 1/2012 | Fischer et al. | 716/122 |
| 2012/0045087 A1* | 2/2012 | Sun et al. | 382/100 |

OTHER PUBLICATIONS

Chen et al. ("Formal Verification of Embedded System Designs At Multiple Levels of Abstraction",IEEE,2002,pp. 125-130).*

Notice of Allowance dated Feb. 20, 2014 for U.S. Appl. No. 13/282,426.

Notice of Allowance dated Dec. 30, 2013 for U.S. Appl. No. 13/282,362.

Virtuoso® Analog Placer User Guide, Product Version 6.1.4, Nov. 2009.

Non-Final Office Action dated May 6, 2013 for U.S. Appl. No. 13/282,362.

Non-Final Office Action dated Jan. 10, 2013 for U.S. Appl. No. 13/282,426.

Final Office Action dated May 16, 2013 for U.S. Appl. No. 13/282,426.

Notice of Allowance dated Sep. 4, 2013 for U.S. Appl. No. 13/282,362.

* cited by examiner

METHODS, SYSTEMS, AND ARTICLES OF MANUFACTURE FOR CREATING OR MANIPULATING ELECTRICAL DATA SETS FOR AN ELECTRONIC DESIGN

CROSS-REFERENCE TO RELATED APPLICATION(S)

This application is cross-related to U.S. patent application Ser. No. 13/282,362, filed concurrently with the title "METHODS, SYSTEMS, AND ARTICLES FOR MULTI-SCENARIO PHYSICALLY-AWARE DESIGN METHODOLOGY FOR LAYOUT-DEPENDENT EFFECTS", and U.S. patent application Ser. No. 13/282,426, filed concurrently with the title "METHODS, SYSTEMS, AND ARTICLES FOR IMPLEMENTING EXTRACTION AND ELECTRICAL ANALYSIS-DRIVEN MODULE CREATION". The content of both applications is hereby expressly incorporated by reference in its entirety.

BACKGROUND

Electrical analysis is crucial during the early stages of electronic designs. For example, designers need currents on terminals and voltages on nodes from simulations of the schematic to evaluate current densities throughout the routing and check those densities against electro-migration related limits, before the design is completed. For analog/mixed-signal designs, the design flows today are mostly manual, relying on separate front-end design by a schematic designer, who sizes or simulates the circuit schematic to build the schematic circuit elements or to meet performance goals, followed by hand-off to a layout designer who places and routes the design. The simulators may save, for example, current and voltage signals across various user selected nodes during the simulation of the circuit. The design environments provide, however, limited capabilities to view the raw simulation outputs and communicate this to the layout designer. For example, the designer may annotate the schematic with labels that represent the DC (direct current) voltages or transistor operating point information. These annotated labels may then be handed off to the layout designer along with some extra labels on the schematic to communicate the layout design intent. For example, some of these labels may identify critical pins (or nets) that the layout designer can use to calculate the width of the pin (or net) based on the maximum current density a piece of layout routing geometry may handle.

In addition, designers may desire to perform simulations of a design across multiple tests. For each of these multiple tests, designers may configure the simulation to run various types of analyses, such as a transient analysis or a DC analysis. The schematic designers may also desire to set up and run advanced analyses of various types, or to further manipulate various setups of the design or simulation tools to create multiple checkpoints from multiple simulation runs. This manual process makes it not only cumbersome but often impossible to analyze the relevant currents or voltages from the resulting simulation outputs from various combinations of the simulation results and correctly communicate that information to the layout designer manually.

Thus, there exists a need for providing a method, a system, and an article of creating or manipulating electrical data sets for an electronic design to better assist designers to communicate the electrical information obtained from various simulations or one or more combinations of various simulations at one abstraction level of the electronic design to designers working at a different abstraction level of the electronic design.

SUMMARY

Disclosed are a method, a system, and an article of manufacture for creating or manipulating data sets for an electronic design across multiple abstraction levels. In various embodiments, the method identifies at least a part of simulation results obtained from a simulation run for an electronic circuit or at least a portion thereof at a first abstraction level. In some embodiments, the method may identify at least a part of multiple sets of simulation results, each of which is obtained from a simulation run for the electronic circuit or at least a portion thereof at the first abstraction level. In some embodiments, the simulation results may be stored in a temporary storage medium such as a random access memory.

In some embodiments, the simulation may be stored in a persistent storage medium, such as a persistent hard disk drive. In some embodiments, the simulation results may be stored in a combination of temporary storage and persistent storage. The method may identify relevant electrical data or information for one or more design under test instances of a master library or a master cell and creates one or more electrical data sets based on the test(s), analysis mode(s), corner case scenario(s), point sweep(s), sweep combination(s), parametric sweep(s), performance goal(s), label(s), or output setting(s) identified or selected in some embodiments. In some embodiments, the one or more electrical data sets may be stored in a temporary storage medium such as a random access memory.

In some embodiments, the one or more electrical data sets be stored in a persistent storage medium, such as a persistent hard disk drive. In some embodiments, the one or more electrical data sets may be stored in a combination of temporary storage and persistent storage. In some embodiments, the simulation that generates the simulation results may be completed. In some other embodiments, the simulation that generates the simulation results need not be completed and may be still running. In these embodiments, the method identifies the partial simulation results and uses the partial simulation results as described in various embodiments below in substantially the same manner and updates the results as more complete simulation results are generated by the simulation.

In some embodiments, the method may further optionally identify one or more preexisting electrical data sets that were previously established for the electronic design or the at least a portion thereof. The method may then compare the one or more electrical data sets created and the one or more preexisting electrical data sets to determine whether and how much the electronic design or the at least the portion thereof from which the one or more electrical data sets are generated is better or worse than the electronic circuit or at least the portion thereof from which the one or more preexisting electrical data sets are generated in these embodiments. In some embodiments, the method may also automatically hand off the one or more electrical data sets to a second abstraction level.

In some embodiments, the method utilizes one or more transformations or mappings to hand off the one or more electrical data sets at the first abstraction level to the second abstraction level. The method may also identify a portion of each of multiple simulation result sets and combine the portions into combined electrical data or information in some embodiments. The method may then update the electronic design or the at least the portion thereof by using the combined electrical data or information in these embodiments. In some embodiments, the method may also hand off the combined electrical data or information to the second abstraction level and invokes the design tool(s) at the second abstraction level to update the electronic design at the second abstraction level. Some embodiments are directed at a computer program product comprising a sequence of instructions which, when executed by at least one processor of a computing system, causes the at least one processor to execute various processes or methods described herein.

In some embodiments, the method comprises the process of identifying or receiving temporary (e.g., the simulation is still running) or completed, partial or complete simulation results and the process of identifying relevant electrical data or information from the simulation results or one or more combinations of multiple simulation result sets generated by multiple simulation runs. In some embodiments, the method may further comprise the process of creating one or more electrical data sets at the first abstraction level from the relevant electrical data or information and the process of generating a view of at least some of the one or more electrical data sets.

The method may provide the view and a plurality of configuration options or choices in a display apparatus in some embodiments. In some embodiments, the method may further comprise the process of invoking an electrical assistant module or initiating an electrical assistant session. In some embodiments, the method may invoke multiple sessions of the electrical assistant. In some embodiments, the method may further comprise the process of identifying or receiving an input to configure the simulation results or the simulation engine. In some embodiments, the method may further comprise the process of configuring the simulation results or the simulation engine based at least in part upon the input.

The method may further identify one or more default configuration choices or options that have been previously established and stored in a system for the method to retrieve in some embodiments. In some embodiments, the method may identify or receive the input from a user. In some embodiments, the method may further comprise the process of identifying a first abstraction level and one or more design under test (DUT) instances of a master cell or library in an electronic design. In these embodiments, the method may identify or receive the simulation results, identify the relevant electrical data or information, and create the one or more electrical data sets at the first abstraction level. In some embodiments, the method may further comprise the process of identifying one or more preexisting electrical data sets that were previously established for the electronic circuit or the DUT instance(s) of the master cell or library from one or more prior simulation runs.

The method may further compare the one or more electrical data sets with or to the one or more preexisting electrical data sets to determine whether or how the electronic design from which the one or more electrical data sets are generated is better or worse than the electronic design from which the one or more preexisting electrical data sets are generated. In some embodiments, the method may further comprise the process of generating a view for the comparison results. In some embodiments, the method may further comprise the process of identifying a first electrical data set and a second electrical data set at the first abstraction level.

In some embodiments, the method may further comprise the process of identifying at least a portion of the electronic design that corresponds to the combined electrical data or information. In some embodiments, the method may further comprise the process of combining a first portion of the first electrical data set and a second portion of the second electrical data set into a combined electrical data or information. In some embodiments, the method may further comprise the process of updating at least a portion of the electronic circuit design that corresponds to the combined electrical data or information at the first abstraction level. In some embodiments, the method may further comprise the process of automatically handing off the updated electronic design to the second abstraction level.

In some embodiments, the method may further comprise the process of identifying one or more instances of the design under test at the second abstraction level to attribute the one or more electrical data sets to. In some embodiments, the method may further comprise the process of analyzing the electronic design or at least a portion thereof to ensure design robustness.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Over section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Over section below.

BRIEF DESCRIPTION OF THE DRAWINGS

The drawings illustrate the design and utility of various embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 13 illustrates a part of an exemplary interface for creating or manipulating electrical data sets for an electronic design in some embodiments.

FIG. 14 illustrates a part of an exemplary interface for creating or manipulating electrical data sets for an electronic design in some embodiments.

FIG. 15 illustrates a part of an exemplary interface for creating or manipulating electrical data sets for an electronic design in some embodiments.

FIG. 16 illustrates a part of an exemplary interface for creating or manipulating electrical data sets for an electronic design in some embodiments.

FIG. 17 illustrates a part of an exemplary interface for creating or manipulating electrical data sets for an electronic design in some embodiments.

FIG. 23 illustrates a part of an exemplary interface for creating or manipulating electrical data sets for an electronic design in some embodiments.

DETAILED DESCRIPTION

Various embodiments of the invention are directed to a methods, systems, and articles of manufacture for implementing electronic circuit designs with electro-migration awareness in a single embodiment or in some embodiments. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Disclosed are a method, a system, and an article of manufacture for creating or manipulating electrical data sets of an electronic design. In one or more embodiments, the method or system assist a designer in handing off relevant electrical data of an electronic design at a first abstraction level to the second abstraction level of the same electronic design to create the electrical data or information at the second abstraction level. In some embodiments, the method or the system uses a mapping or transformation to map or transform the electrical data or information at the first abstraction level to the corresponding electrical data or information at the second abstraction level.

In some embodiments, the method or the system receives a designer's input and automatically performs or invokes other modules or processes to perform various computations for the electronic design. For example, the method or the system may allow a designer at a first abstraction level to configure or select individual, for example, sweep points or corners or all sweep points or all corners, and the method or the system automatically computes all possible values based on the designer's configuration or selection of sweep points or corners. The method or the system further provide the options to group, classify, color code, or sort various display data in a user interface.

Figure 1:
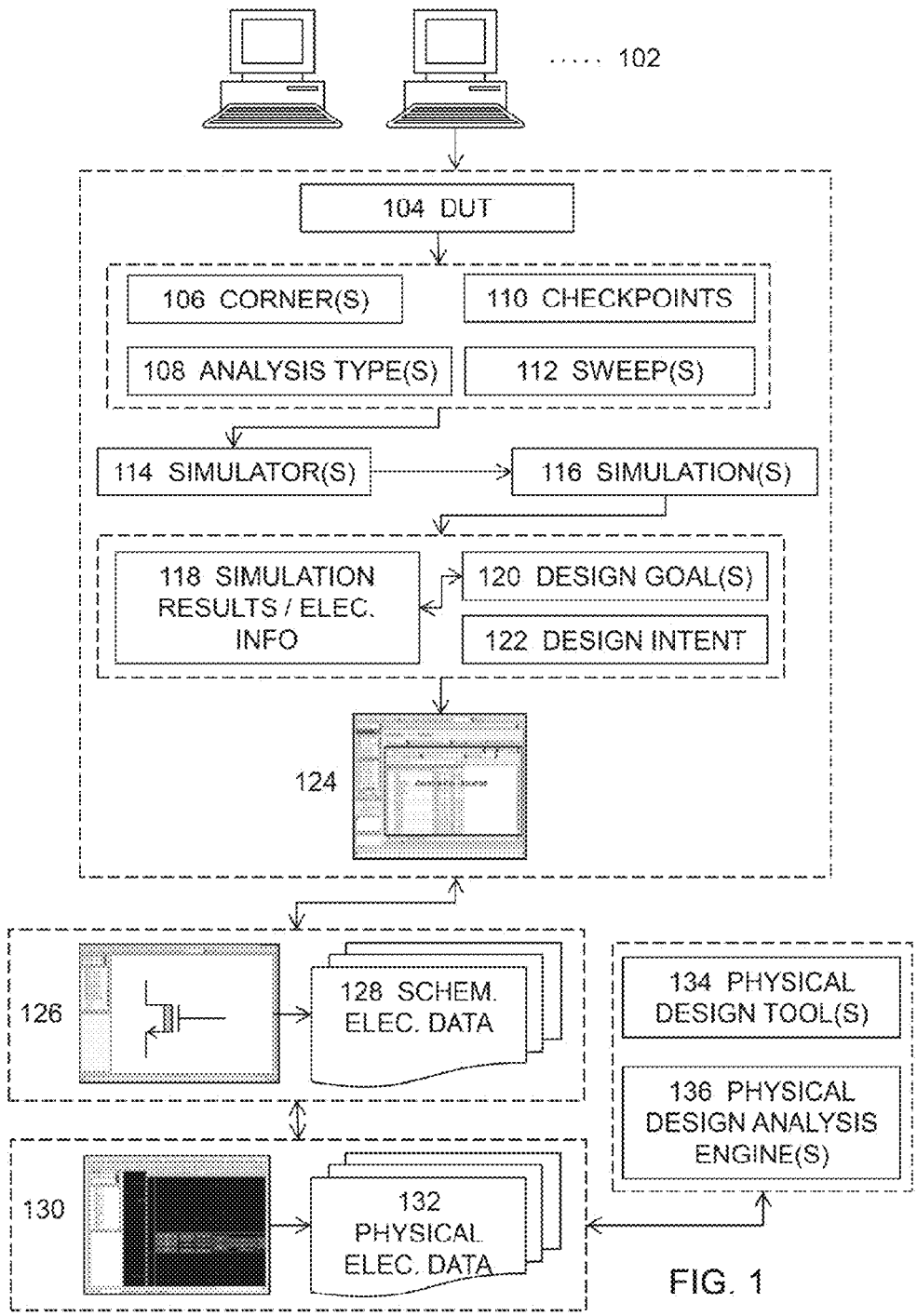
FIG. 1 illustrates a high level block diagram for a method or a system for creating or manipulating electrical data sets for an electronic circuit design in some embodiments.

FIG. 1 illustrates a high level block diagram for a method or a system for creating or manipulating electrical data sets for an electronic circuit design in some embodiments. In one or more embodiments, a designer may use one or more computing systems 102 to perform various processes or to invoke various hardware modules to create or manipulate one or more electrical data sets for an electronic design. The one or more computing systems 102 may comprise various electronic design tools such as, but not limited to, a schematic editor, a schematic simulator, a physical design tool, a physical design analysis engine, etc. The method or the system may first identify a design under test (DUT) instance 104 in some embodiments.

In some embodiments, a DUT includes an electronic design at a first abstraction level that comprises, for example, a schematic level. In some embodiments, the method or the system may identify more than one DUT instance of the electronic design to ensure that the electronic design is robust across these more than one DUT instances. The method or the system may further identify one or more analysis corners 106, one or more analysis types 108, one or more checkpoints 110, one or more sweep points 112, one or more variables or parameters and associated equations, or one or more combinations of any of the above in some embodiments. In some embodiments, the one or more analysis types may comprise, for example but not limited to, a DC (direct current) analysis, a transient analysis, a parametric sweep, a combination sweep, a corner analysis, a Monte Carlo statistical analysis, multiple checkpoints for multiple simulation runs, any other analysis types, or any combination of the above.

The method or the system may further provide the DUT instance 104 and the one or more analysis corners 106, one or more analysis types 108, one or more checkpoints 110, one or more sweep points 112, one or more variables or parameters and associated equations, or one or more combinations of the above to a simulator 114 at the first abstraction level to perform one or more simulation runs 116 to obtain simulation results or electrical information 118 for the electronic design including the DUT instance 104 in some embodiments. The method or the system may also check the simulation results or electrical information 118 against one or more design goals 120 or the design intent 122 to determine whether the electronic design meet the one or more design goals 120 or the design intent 122 in some embodiments.

The method or the system may then invoke an electrical view assistant 124 to identify or determine relevant data or information from the simulation results or electrical information 118 to create or manipulate one or more electrical data sets 128 associated with the DUT instance 104 (displayed as a schematic symbol 126) in some embodiments. The method or the system may further automatically hand-off the one or more electrical data sets 128 to another abstraction level, such as a physical design level, for the corresponding physical design 130 of the schematic design element 126 and performs physical design or physical design analyses or invokes one or more physical design tools 134 or one or more physical design analysis engines 136 to perform physical design or physical design analyses in some embodiments.

It shall be noted that in the exemplary illustration of FIG. 1, the first abstraction level and the second abstraction level are respectively denoted as the schematic level and the physical design level for ease of illustration and explanation. Nonetheless, the exemplary illustration or implementation of FIG. 1 is not intended to limit the scope of various embodiments as described herein. It shall also be noted that FIG. 1 further illustrates the two-way communications between the first abstraction level of the electronic design and the second abstraction level of the electronic design. In other words, the method or the system may identify and populate necessary changes on the second abstraction level (e.g., the physical design space) back to the first abstraction level (e.g., the schematic design space) and vice versa.

Figure 2:
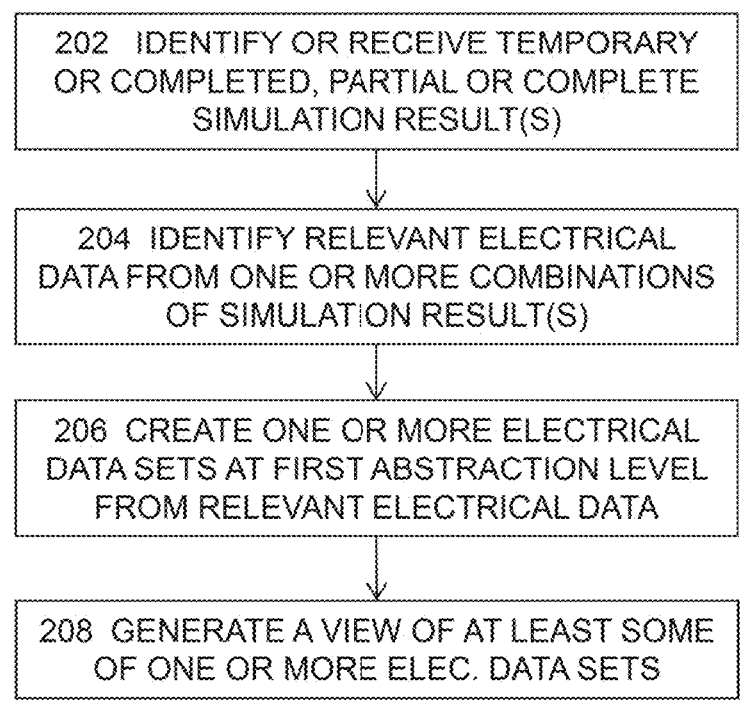
FIG. 2 illustrates a high level flow diagram for a method or a system for creating or manipulating one or more electrical data sets for an electronic design in some embodiments.

FIG. 2 illustrates a high level flow diagram for a method or a system for creating or manipulating one or more electrical data sets for an electronic design in some embodiments. In one or more embodiments, a designer may utilize one or more computing systems to perform the processes described herein. In some embodiments, the one or more computing systems may comprise, for example, a schematic editor, a stand-alone or an integrated electrical assistant module, a layout editor, a schematic simulator, or one or more layout analysis engines. In some embodiments, the method or the system comprises the respective process or hardware module 202 for identifying or receiving partial or complete simulation results for an electronic design at a first abstraction level.

In some embodiments, the first abstraction level comprises a schematic design level. In some embodiments, the partial or complete simulation results may be temporarily stored in a volatile memory. In some embodiments, the partial or complete simulation results may be persisted in a persistent storage device, such as a hard disk drive. In some embodiments where the entire electronic circuit is simulated to obtain the complete simulation results, but the design under test 104 represents only a smaller portion of the entire electronic design, the method or the system may identify or receive only a portion but not all of the complete simulation results at 202.

For example, if the DUT constitutes an inverter, the method or the system may identify the simulation results for the inverter alone in some embodiments or for the inverter and some peripheral interconnects and components within a radius of influence in some other embodiments at 202. In some embodiments, the method or the system may further respectively comprise the process or hardware module 204 of identifying relevant electrical data from at least some of the partial or complete, temporary or persistent simulation results or one or more combinations of the partial or complete, temporary or persistent simulation results. For example, the method or the system may identify the DC currents, current waveforms, or voltages at or through various nodes, such as some critical pins or nets, in an electronic design in some embodiments.

The method or the system may also identify a first portion of electrical information from a first simulation result and a second portion of electrical information from a second simulation result of a second simulation run for the same electronic design at 204 in some embodiments. For example, the method or the system may identify the relevant electrical information for a first component from a first set of simulation result that is based on a first corner analysis and may further identify the relevant electrical information for a second component from a second set of simulation result that is based on a second corner analysis at 204 in some embodiments. The method or the system may also identify the relevant electrical information based on the designer's input in some embodiments.

In some embodiments, the designer's input may include, for example but not limited to, identification of critical component(s) or net(s), identification or selection of the DUT instance(s), variables or equations of some components to be simulated, analysis type(s), one or more parameters or one or more combinations thereof for one or more device instances in the electronic design, one or more sweep point combinations, one or more parametric sweeps for one or more device instance parameters, one or more checkpoints, one or more corner case scenarios for design variables or parameters for one or more process parameters (e.g., temperatures), various output settings, one or more performance goals, one or more labels that a designer at the first abstraction level to communicate, for example, design intent or other design related information to the designer at the second abstraction level, or any other information or data.

In some embodiments, an instance comprises an occurrence of a copy of an object, such as a parameterized master cell of an electronic design. In these embodiments, the instances of the parameterized master cell share the same set of attributes or parameters but may differ in the values of what these attributes or parameters may contain. In some embodiments, the method or the system may identify the input from within the system. For example, the system may identify various component(s), net(s), or DUT instance(s) from the electronic design in some embodiments. The method or the system may identify various variables, parameters, or any analysis types in some embodiments.

The method or system may also generate a complete set of output and present only a smaller portion based on one or more output template while providing the options for customizing or tailoring the output as a designer desires. In some embodiments, the method or the system may further respectively comprise the process or hardware module 206 of creating one or more electrical data sets at the first abstraction level from the relevant electrical data that are identified at 204. In some embodiments, the method or the system may create and store the one or more electrical data sets in a persistent storage device or persistent storage medium. In some embodiments, the method or the system may create and store the one or more electrical data sets in a volatile storage such as the random access memory of a computing system.

In some embodiments, the method or the system may further respectively comprise the process or hardware module 208 of generating a view of at least some of the one or more electrical data sets. In some embodiments, the method or the system may generate the view at 208 for the electronic design such that a designer working on the electronic design at the second abstraction level may utilize the information or data in the view. In some embodiments, the method or the system may further automatically hand-off the one or more electrical data sets to the second abstraction level. In some embodiments, the method or the system may integrate the view within one or more design tools at the first abstraction level, the second abstraction, or both.

In some embodiments, the method or the system may update at least portion of the electronic design at the second abstraction level based at least in part upon the one or more electrical data sets. In some embodiments, the method or the system may use a transform between the first abstraction and the second abstraction to map the combined electrical data or information or the one or more electrical data sets from the first abstraction level to the second abstraction level. In some embodiments, the method or the system may further comprise the respective process or hardware module for updating at least a portion of the electronic design at the second abstraction level based at least in part upon the one or more electrical data sets.

In some embodiments, the method or the system may further comprise the respective process or hardware module for identifying a first portion of the electronic design at the first abstraction level that is affected by one or more changes in the action of updating at least a portion of the electronic design at the second abstraction level. In some embodiments, the method or the system may further comprise the respective process or hardware module for transferring the one or more changes from the second abstraction level to the first abstraction level by using an inverse transform that maps data or information from the second abstraction level to the first abstraction level. In some embodiments, the method or the system may further comprise the respective process or hardware module for updating at least the first portion of the electronic design by using at least the one or more changes that are mapped from the second abstraction level to the first abstraction level. In these embodiments, the electrical assistant module provides a two-way communication and bridges the first abstraction level and the second abstraction level to transmit data or information between the first abstraction level and the second abstraction level.

In some other embodiments, the method or the system may generate the view in a stand-alone module that cooperates with the first abstraction level, the second abstraction, or both. For example, the view may be generated and presented in an electrical assistant that is either integrated within the schematic editor, the schematic level simulator(s), the layout editor, the layout analysis engine(s), or any combination of the aforementioned tools in some embodiments, or that constitutes a stand-alone module that cooperates with the schematic editor, the schematic level simulator(s), the layout editor, the layout analysis engine(s), or any combination of the aforementioned tools in some other embodiments.

Figure 3:
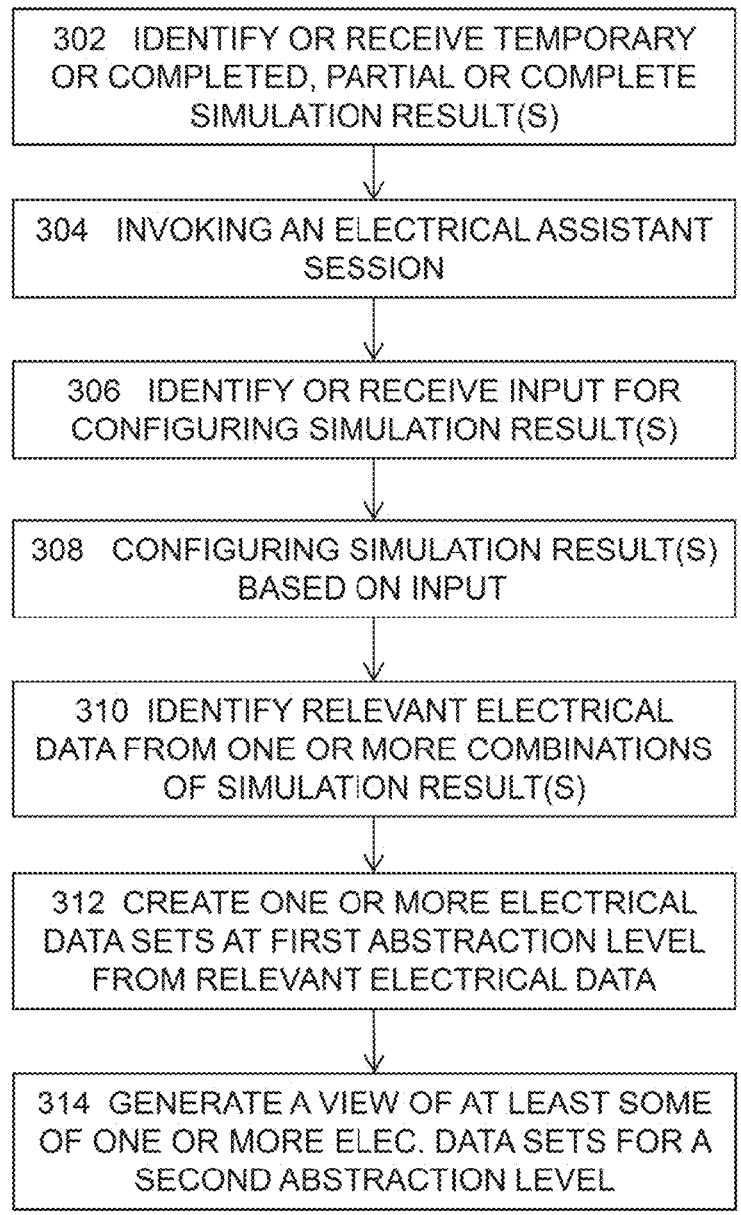
FIG. 3 illustrates more detailed flow diagram for a method or a system for creating or manipulating one or more electrical data sets for an electronic design in some embodiments.

FIG. 3 illustrates more detailed flow diagram for a method or a system for creating or manipulating one or more electrical data sets for an electronic design in some embodiments. In one or more embodiments, a designer may utilize one or more computing systems to perform the processes described herein. In some embodiments, the one or more computing systems may comprise, for example, a schematic editor, a stand-alone or an integrated electrical assistant module, a layout editor, a schematic simulator, or one or more layout analysis engines. In some embodiments, the method or the system comprises the respective process or hardware module 302 for identifying or receiving partial or complete simulation results for an electronic design at a first abstraction level.

In some embodiments, the first abstraction level comprises a schematic design level. In some embodiments, the partial or complete simulation results may be temporarily stored in a volatile memory. In some embodiments, the partial or complete simulation results may be persisted in a persistent storage device, such as a hard disk drive. In some embodiments where the entire electronic circuit is simulated to obtain the complete simulation results, but the design under test 104 represents only a smaller portion of the entire electronic design, the method or the system may identify or receive only a part but not all of the complete simulation results at 302. In some embodiments, the method or the system comprises the respective process or hardware module 304 for invoking an electrical assistant module or initiating an electrical assistant session.

In some embodiments, the method or the system may initiate multiple sessions of the electrical assistant. In some embodiments, the method or the system comprises the respective process or hardware module 306 for identifying or receiving input for configuring the simulator(s) or the simulation result(s). In some embodiments, the method or the system comprises the respective process or hardware module 308 for configuring the simulation results based at least on an input. In some embodiments, the input comprise a designer's input. In some embodiments, the method or the system may identify the input from within the system's various stored data or information.

In some embodiments, the method or the system may identify a part of the input from a designer's input and another part of the input from within the system's various stored data or information. In some embodiments, the designer's input may include, for example but not limited to, identification of critical component(s) or net(s), identification or selection of the DUT instance(s), variables or equations of some components to be simulated, analysis type(s), one or more parameters or one or more combinations thereof for one or more device instances in the electronic design, one or more sweep point combinations, one or more parametric sweeps for one or more device instance parameters, one or more checkpoints, one or more corner case scenarios for design variables or parameters for one or more process parameters (e.g., temperatures), various output settings, one or more performance goals, one or more labels that a designer at the first abstraction level to communicate, for example, design intent or other design related information to the designer at the second abstraction level, or any other information or data.

In some embodiments, the method or the system may identify the input from within the system's various stored data or information. For example, the system may identify various component(s), net(s), or DUT instance(s) from the electronic design in some embodiments. The method or the system may identify various variables, parameters, or any analysis types in some embodiments. The method or system may also generate a complete set of output and present only a smaller portion based on one or more output template while providing the options for customizing or tailoring the output as a designer desires. In some embodiments, the method or the system comprises the respective process or hardware module 310 for identifying relevant electrical information or data from one or more simulation results of one or more simulation runs or one or more combinations of at least a part of some of the one or more simulation results.

For example, the method or the system may identify at least a part of the simulation result of a first simulation run for a first DUT instance of a schematic device and at least a part of the simulation result of a second simulation run for a second DUT instance of the schematic device at 310 in some embodiments. In some embodiments, the method or the system comprises the respective process or hardware module 312 for creating one or more electrical data sets for the electronic design at the first abstraction level from the relevant electrical data or information identified at 310. In some embodiments, the method or the system may create and store the one or more electrical data sets in a persistent storage device.

In some embodiments, the method or the system may create and store the one or more electrical data sets in a volatile storage such as the random access memory of a computing system. In some embodiments, the method or the system comprises the respective process or hardware module 314 for generating a view for at least some of the information or data in the one or more electrical data sets. In some embodiments, the method or the system may generate the view at 314 for the electronic design such that a designer working on the electronic design at the second abstraction level may utilize the information or data in the view. In some embodiments, the method or the system may further automatically hand-off the one or more electrical data sets to the second abstraction level.

Figure 4:
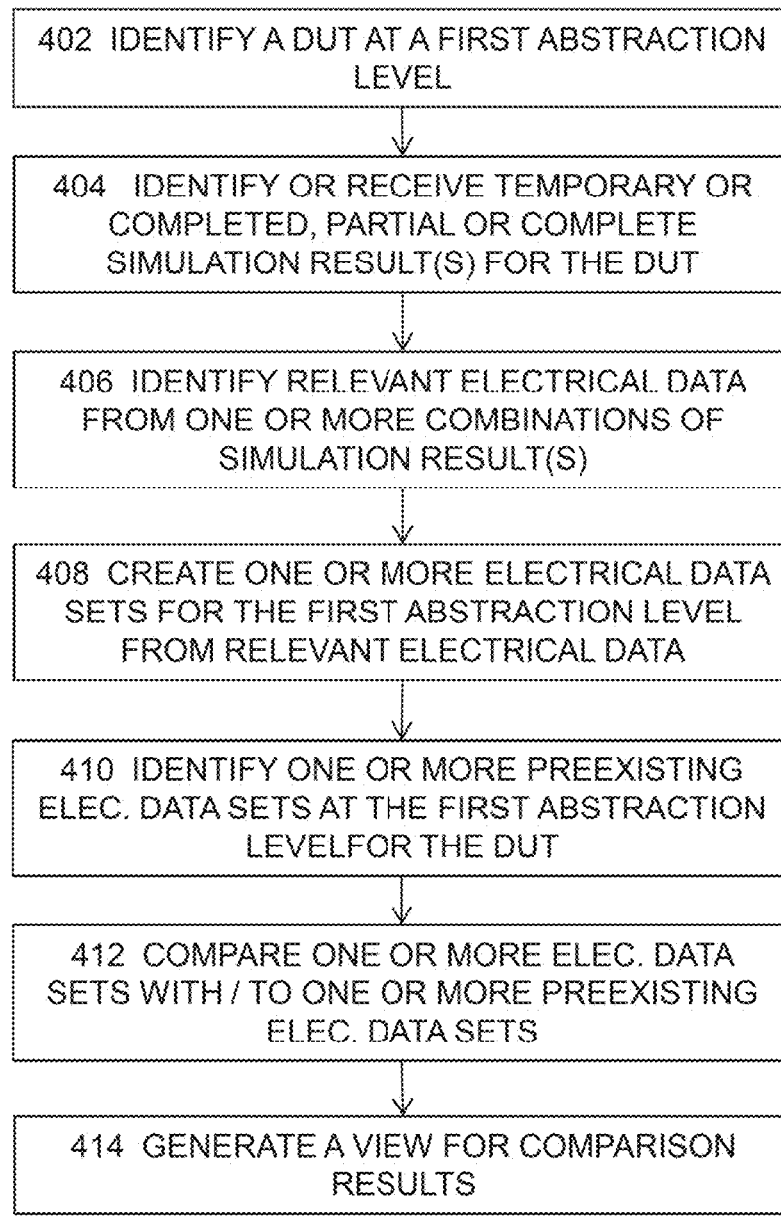
FIG. 4 illustrates more detailed flow diagram for a method or a system for creating or manipulating one or more electrical data sets for an electronic design in some embodiments.

FIG. 4 illustrates more detailed flow diagram for a method or a system for creating or manipulating one or more electrical data sets for an electronic design in some embodiments. In one or more embodiments, a designer may utilize one or more computing systems to perform the processes described herein. In some embodiments, the one or more computing systems may comprise, for example, a schematic editor, a stand-alone or an integrated electrical assistant module, a layout editor, a schematic simulator, or one or more layout analysis engines. In some embodiments, the method or the system comprises the respective process or hardware module 402 for identifying a DUT at a first abstraction level.

In some embodiments, a design under test comprises a schematic design instance of a schematic design component in the electronic design at the schematic design level. It shall be noted that multiple instances for a schematic design component in an electronic design, and that these multiple instances may be identical or different at different locations of the electronic design, depending on, for example, the corresponding values of one or more parameters for a parameterized design or a parameterized cell master at different locations within the electronic design. In some embodiments, the method or the system comprises the respective process or hardware module 404 for identifying or receiving partial or complete simulation results for the design under test.

In some embodiments, the partial or complete simulation results may be temporarily stored in a volatile memory. In some embodiments, the partial or complete simulation results may be persisted in a persistent storage device, such as a hard disk drive. In some embodiments where the entire electronic circuit is simulated to obtain the complete simulation results, but the design under test represents only a smaller portion of the entire electronic design, the method or the system may identify or receive only a part but not all of the complete simulation results at 404. In some embodiments, the method or the system comprises the respective process or hardware module 406 for identifying or determining relevant electrical data from at least some of the partial or complete, temporary or persistent simulation results or one or more combinations of the partial or complete, temporary or persistent simulation results.

The method or the system may also identify a first portion of relevant electrical information from a first simulation result and a second portion of relevant electrical information from a second simulation result of a second simulation run for the same electronic design at 406 in some embodiments. In some embodiments, the method or the system comprises the respective process or hardware module 408 for creating one or more electrical data sets at the first abstraction level from the relevant electrical data that are identified at 406. In some embodiments, the method or the system may create and store the one or more electrical data sets in a persistent storage device or persistent storage medium.

In some embodiments, the method or the system may create and store the one or more electrical data sets in a volatile storage such as the random access memory of a computing system. In some embodiments, the method or the system comprises the respective process or hardware module 410 for identifying one or more preexisting electrical data sets that have been created for the design under test instance or another instance at the first abstraction level of the design under test master. For example, the method or the system may identify a first preexisting electrical data set generated in a first simulation run for the same DUT instance for which the method or the system is creating the one or more electrical data set in some embodiments.

The method or the system may also identify one or more preexisting electrical data sets for the same DUT instance or one or more other instances of the same master. For example, the method or the system may identify one or more preexisting electrical data sets that are generated for the same DUT instance in one or more other simulation runs performed for different type(s) of analysis, different test(s), different sweep point combination(s), different parametric sweep(s), different corner case scenario(s), or different process parameter value(s) in some embodiments. The method or the system may in addition or in the alternative identify one or more preexisting electrical data sets that are generated for one or more different instances of the master of the DUT instance in one or more other simulation runs performed for, for example, different configuration(s) of the DUT master or different value(s) of one or more parameters of the parameterized DUT master.

In some embodiments, the method or the system comprises the respective process or hardware module 412 for comparing the one or more electrical data sets with or to the one or more preexisting data sets to identify or determine the differences or similarities between these two sets of electrical data sets. For example, the method or the system may identify one or more preexisting electrical data sets for all instances of the DUT master in an electronic design at 410 and compare the one or more electrical data sets generated at 408 with or to the one or more preexisting data sets in some embodiments.

One of the advantages of these embodiments is that the electrical data or information for all instances of the DUT master are readily available, and thus a designer may ensure the robustness of all the DUT instances of the DUT master in the electronic design. As another example, the method or the system may identify one or more preexisting first electrical data sets generated from a first simulation run for a first corner scenario for the DUT instance and then compare the one or more electrical data sets generated at 408 with or to the one or more preexisting first electrical data sets to determine how much better or worse the DUT instance is compared to the DUT instance in the first corner scenario in some embodiments. As another example in which the one or more electrical data sets are generated for a DUT instance at 408 for a first corner scenario, the method or the system may identify one or more preexisting electrical data sets generated for the DUT instance in a second corner scenario.

The method or the system may then compare the one or more electrical data sets generated at 408 and the one or more preexisting electrical data sets to compare the two corner scenarios. In some embodiments, the comparison of the one or more electrical data sets and the one or more preexisting electrical data sets on an element by element basis. That is, the method or the system may identify the relevant portion of the electrical data sets and perform the comparison for a particular instance of the electronic design at an abstraction level. For example, the method or the system may identify the relevant portion of the electrical data sets and performs the comparison between the one or more preexisting data sets and the one or more electrical data sets for a particular schematic element instance of an electronic circuit at the schematic level.

In some embodiments, the method or the system comprises the respective process or hardware module 414 to generate a view for the comparison results. In some embodiments, the method or the system may generate the view at 414 for the electronic design such that a designer working on the electronic design at the second abstraction level may utilize the information or data in the view. In some embodiments, the method or the system may further automatically hand-off the one or more electrical data sets to the second abstraction level. In some embodiments, the method or the system may integrate the view within one or more design tools at the first abstraction level, the second abstraction, or both. In some other embodiments, the method or the system may generate the view in a stand-alone module that cooperates with the first abstraction level, the second abstraction, or both.

Figure 5:
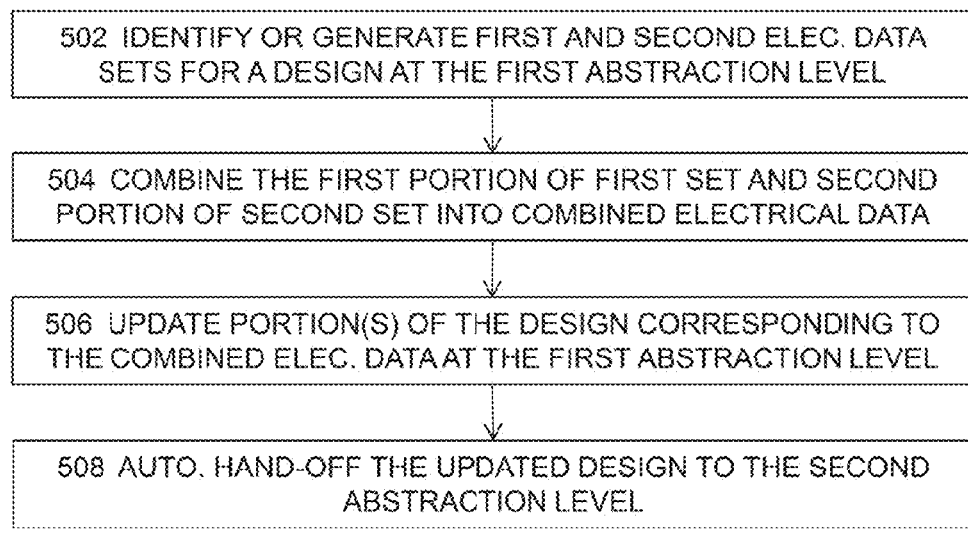
FIG. 5 illustrates a high level flow diagram for a method or a system for creating or manipulating one or more electrical data sets for an electronic design in some embodiments.

FIG. 5 illustrates a high level flow diagram for a method or a system for creating or manipulating one or more electrical data sets for an electronic design in some embodiments. In one or more embodiments, a designer may utilize one or more computing systems to perform the processes described herein. In some embodiments, the one or more computing systems may comprise, for example, a schematic editor, a stand-alone or an integrated electrical assistant module, a layout editor, a schematic simulator, or one or more layout analysis engines.

In one or more embodiments, the method or the system may comprise the respective process or hardware module 502 for identifying or generating a first electrical data set and a second electrical data set for a design under test instance at the first abstraction level. In some embodiments, the method or the system may comprise the respective process or hardware module 504 for combining a first portion of the first electrical data set and a second portion of the second electrical data set. For example, the method or the system may identify the worst-case electrical data or information from both the first electrical data set and the second electrical data set that belong to various analysis modes, tests, sweep points, corner selections, or DUT instance selections.

In some embodiments, the method or the system may comprise the respective process or hardware module 506 for updating one or more portions of the electronic design that correspond to the combined electrical data at the first abstraction level. For example, the method or the system may identify the worst-case data or information from each of the first and the second electrical data sets, combine the worst-case data or information into a worst-case combination, and update the corresponding portion(s) of the electronic design with the worst-case combination. In some embodiments, the method or the system may comprise the respective process or hardware module 508 for automatically handing off the updated design to the second abstraction level.

In some embodiments where the first abstraction level comprises a schematic level, the method or the system may automatically hand off the updated design to the physical design level at 508. The method or the system may also iteratively repeat the above flow in some embodiments. For example, the method or the system may update the electronic design with the combined electrical data at 506. In this example, the simulator or an analysis engine residing in the background to monitor the updated electronic design may create or the method or the system may cause the simulator or an analysis engine residing in the background to create another set of worst-case data or information that is different from the previously identified worst-case data or information.

The method or the system may provide the option to further combine this most recently generated worst-case data or information into the combined worst-case data or information and update the appropriate portions of the electronic design iteratively. In some embodiments, the method or the system iteratively performs the above actions until no further worst-case data or information is created or until a predetermined criterion to stop combining electrical data or information.

Figure 6:
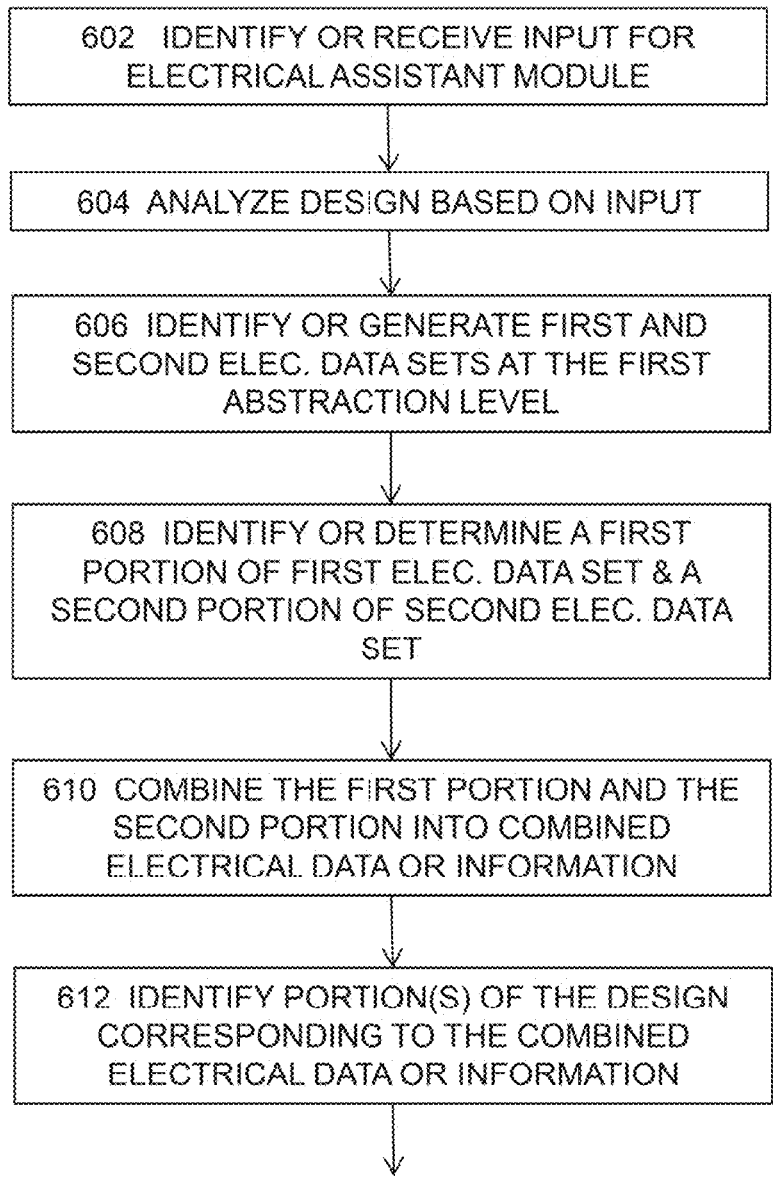
FIG. 6 illustrates more detailed flow diagram for a method or a system for creating or manipulating one or more electrical data sets for an electronic design in some embodiments.
Figure 6:
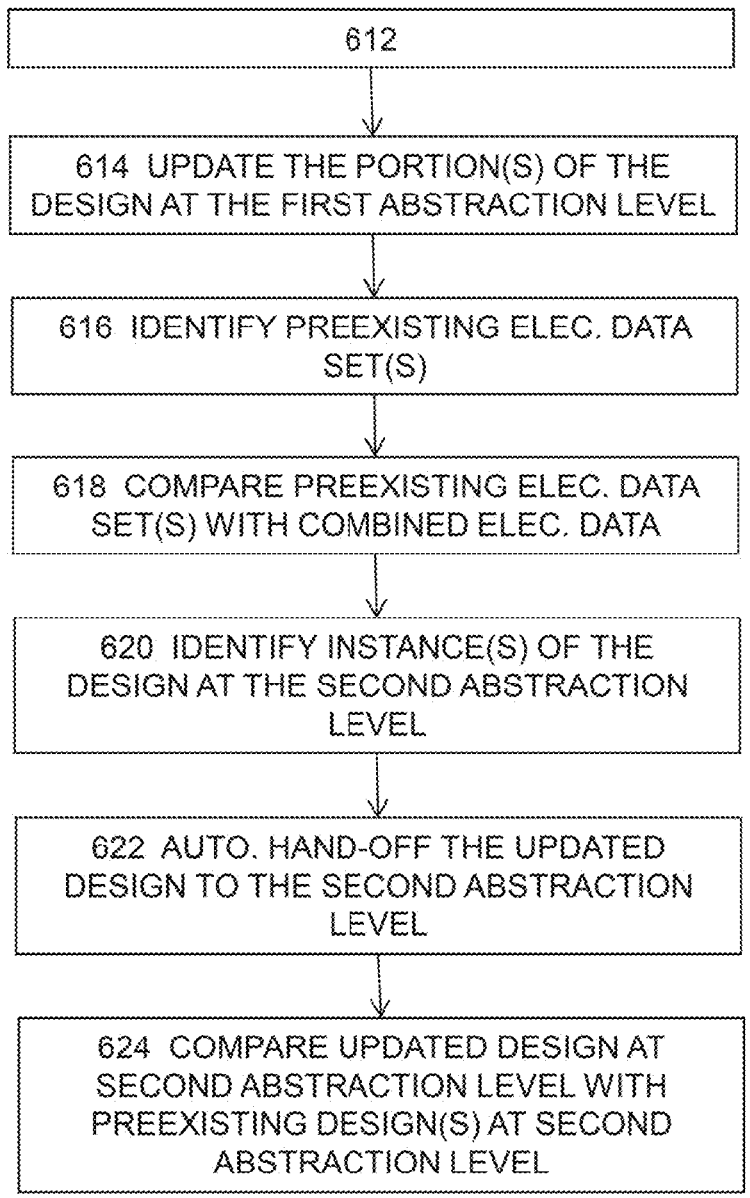

FIG. 6 illustrates more detailed flow diagram for a method or a system for creating or manipulating one or more electrical data sets for an electronic design in some embodiments. In one or more embodiments, a designer may utilize one or more computing systems to perform the processes described herein. In some embodiments, the one or more computing systems may comprise, for example, a schematic editor, a stand-alone or an integrated electrical assistant module, a layout editor, a schematic simulator, or one or more layout analysis engines.

In one or more embodiments, the method or the system may comprise the respective process or hardware module 602 for identifying or receiving input for an electrical assistant module. In some embodiments, the method or the system may identify or receive the input from a designer. In some embodiments, the method or the system may identify the input from one or more default or stored profiles that have been previously established. In some embodiments, the one or more default or stored profiles may be previously established for one or more other electronic designs that are similar to the electronic design at hand.

In some embodiments, the input comprises the identification or selection of the DUT instance(s) in the electronic design. An electronic design may comprise multiple instances of the design under test, and these multiple instances of the design under test may be identical and are instantiated in different locations of the electronic design in some embodiments. In some embodiments, some of the multiple DUT instances may be different in an electronic design.

For example, two different DUT instances may be instantiated with different parameter values for a parameter of the DUT master. In some embodiments, the input may comprise analysis modes such as DC (direct current) analysis, transient analysis, Monte Carlo statistical analysis, etc. In some embodiments, the input may comprise one or more variables of a design element (e.g., width of a pin) or one or more corresponding equations to be simulated or analyzed. In some embodiments, the input may comprise one or more tests to be analyzed or examined, one or more sweep point combinations, one or more instance parameters or variables, one or more corner case scenarios, or one or more process parameter values.

In some embodiments, the input may comprise one or more output settings. For example, the method or the system may identify what electrical data or information for which design component (e.g., critical components or nets or all components or nets) to output. In some embodiments, the input may comprise one or more performance goals or design intent for the entire electronic design, a portion thereof, or a particular component or module that need to be communicated to designers working on the electronic design at a different abstraction level. In some embodiments, the input comprises one or more labels with which a designer uses to annotate the design at a first abstraction level to communicate various data or information to designers at different abstraction level(s).

In some embodiments, the input may comprise configurations of simulator(s) or other analysis engine(s). In one or more embodiments, the method or the system may comprise the respective process or hardware module 604 for analyzing an electronic design based at least in part upon the input. In some embodiments, the method or the system may comprise the respective process or hardware module 604 for analyzing an electronic design based at least in part upon the input to ensure the robustness of the electronic design. In some embodiments, the method or the system may perform one or more simulations (e.g., a schematic simulation in cases where the first abstraction level comprises a schematic level) or other electrical analyses at 604 based at least in part upon the input.

In some embodiments, the method or the system may comprise the respective process or hardware module 606 for identifying or generating a first electrical data set and a second electrical data set at the first abstraction level to capture the results of analyzing the electronic design of 604. In some embodiments, the method or the system may further comprise the respective process or hardware module for identifying or determining relevant electrical information or data from the first electrical data set or the second electrical data set, rather than using the entire first electrical data set or the entire second electrical data set. In some embodiments, the method or the system may comprise the respective process or hardware module 608 for identifying or determining a first portion of the first electrical data set and a second portion of the second electrical data set.

For example, the method or the system may identify the first portion that includes the data or information for the worst-case corner case scenario for the DUT instance in a first simulation run and the second portion that includes the data or information for the worst-case corner case scenario for the DUT instance in a second simulation run in some embodiments. In some embodiments, the first portion of the first electrical data set and the second portion of the second electrical data set may correspond to different portions of the electronic circuit or the DUT instance (e.g., a different pin or terminal).

In some embodiments, the first portion of the first electrical data set and the second portion of the second electrical data set may correspond to the same portion(s) of the electronic circuit or the DUT instance but exhibit different data or information for their respective worst-case corner case scenarios. In some embodiments, the method or the system may comprise the respective process or hardware module 610 for combining the first portion and the second portion into combined electrical data or information. In some embodiments, the method or the system may comprise the respective process or hardware module 612 for identifying one or more portions of the electronic design or the DUT instance at hand that correspond to the combined electrical data or information.

In some embodiments, the method or the system may identify the one or more portions by using at least the first portion of the first electrical data set, the second portion of the second electrical data set. In some embodiments, the method or the system may identify the one or more portions by further using the connectivity information or the netlist of the electronic design. In some embodiments, the method or the system may identify the one or more portions by first locating the components corresponding to the combined electrical data or information and then by using a radius of influence to identify other peripheral components to form the one or more portions.

In some embodiments, the method or the system may comprise the respective process or hardware module 614 for updating the portions of the design at the first abstraction level according to the combined electrical data or information. In some embodiments, the method or the system may optionally comprise the respective process or hardware module 616 for identifying one or more preexisting electrical data sets. In some embodiments, the method or the system identifies the one or more preexisting electrical data sets in a substantially similar manner as that described for 410.

In some embodiments, the method or the system may comprise the respective process or hardware module 618 for comparing the one or more preexisting electrical data sets with the combined electrical data or information. In some embodiments, the method or the system compares the one or more preexisting electrical data sets with the combined electrical data or information in a substantially similar manner as that described for 412. In some embodiments, the method or the system may comprise the respective process or hardware module 620 for identifying one or more instances at the second abstraction level that correspond to the DUT instance at the first abstraction level.

In some embodiments, the method or the system may further identify one or more other components (e.g., interconnects, pins, terminals, etc.) that are connected to the DUT instance at the second abstraction level at 620. In some embodiments, the method or the system may comprise the respective process or hardware module 622 for automatically handing off the updated design to the second abstraction level. For example, if two different instances are instantiated in a schematic design for a schematic master device where the first instance of the two instances is updated based at least in part upon the combined electrical data or information, the method or the system may identify the respective, corresponding layout instances for each of the two schematic instances so the correct electrical data or information may be attributed to the appropriate layout instances.

In some embodiments, the method or the system may further invoke or utilize various design tools or engines at the second abstraction level to update the electronic design at the second abstraction level based at least in part upon the updated design of 614. In some embodiments, the method or the system may comprise the respective process or hardware module 624 for comparing the updated design at the second abstraction level to one or more preexisting designs at the second abstraction level to identify or determine whether and how the updated design is better or worse than the one or more preexisting designs.

Figure 7:
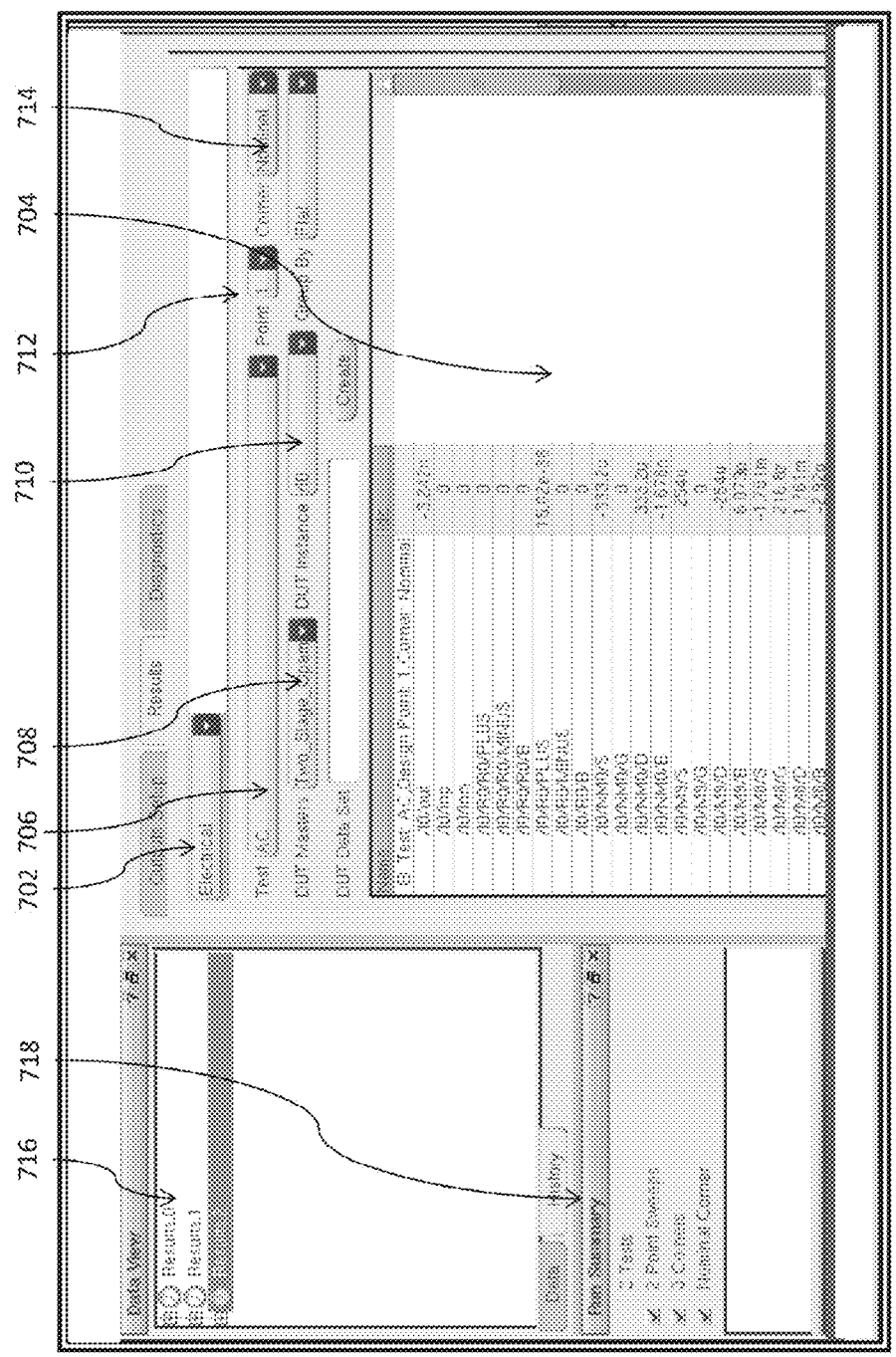
FIG. 7 illustrates a part of an exemplary interface for creating or manipulating electrical data sets for an electronic design in some embodiments.

FIG. 7 illustrates a part of an exemplary interface for creating or manipulating electrical data sets for an electronic design in some embodiments. More specifically, FIG. 7 illustrates a design environment that provides a designer with access to an electrical assistant module. In the exemplary interface, a user may invoke or initiate an electrical assistant module session by selecting "Electrical" 702 from the pull down menu. The method or the system automatically retrieves the appropriate data or information from the various simulation or analysis results 716 ("Results.0", "Reults.1", and "Results.2" shown) and display the data or information in the area 704 under one of a plurality of tabs ("Outputs Setup", "Results", and "Diagnostics" shown).

In the example illustrated in FIG. 7, the display area 704 lists some electrical data or information of certain nodes or components (e.g., terminals or pins). The exemplary interface further displays the options for selecting the type of test or analysis 706 ("AC" or "alternating current" test or analysis shown), the DUT master(s) 708, the DUT instance 710 corresponding to the DUT master, the point sweep(s) 712 ("1", the corner case scenario 714 ("Nominal" corner case scenario displayed), the Data View panel 716 showing the available result ("Results.0", "Results.1", and "Results.2" shown), and a "Run Summary" showing a summary of the simulation run. In some embodiments, the user, the method, or the system may select any specific master cell or library, some masters by their respective functions, nets, etc., or all masters for the "DUT Masters" selector.

Figure 8:
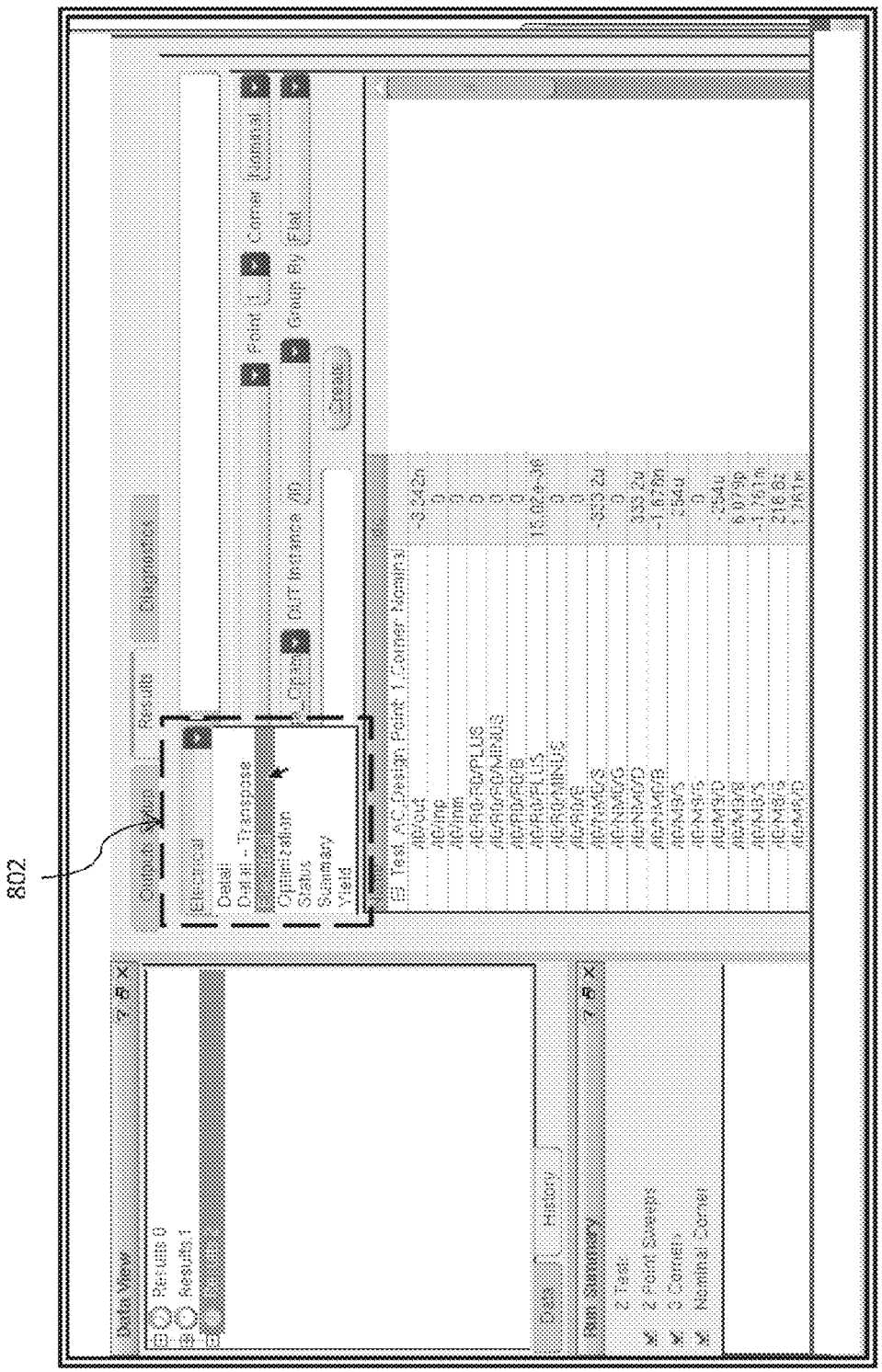
FIG. 8 illustrates a part of an exemplary interface for creating or manipulating electrical data sets for an electronic design in some embodiments.

FIG. 8 illustrates a part of an exemplary interface for creating or manipulating electrical data sets for an electronic design in some embodiments. More particularly, FIG. 8 shows the options made available to a user. More specifically, the pull down menu 802 in the exemplary interface shows that the user has a choice among several options ("Detail", "Detail Transpose", "Electrical", "Optimization", "Status", "Summary", and "Yield" shown) among which "Electrical" invokes the electrical assistant module or initiates an electrical assistant session. The selection of "Electrical" in the pull-down menu launches the electrical assistant and refreshes the exemplary interface as shown in FIG. 9.

Figure 9:
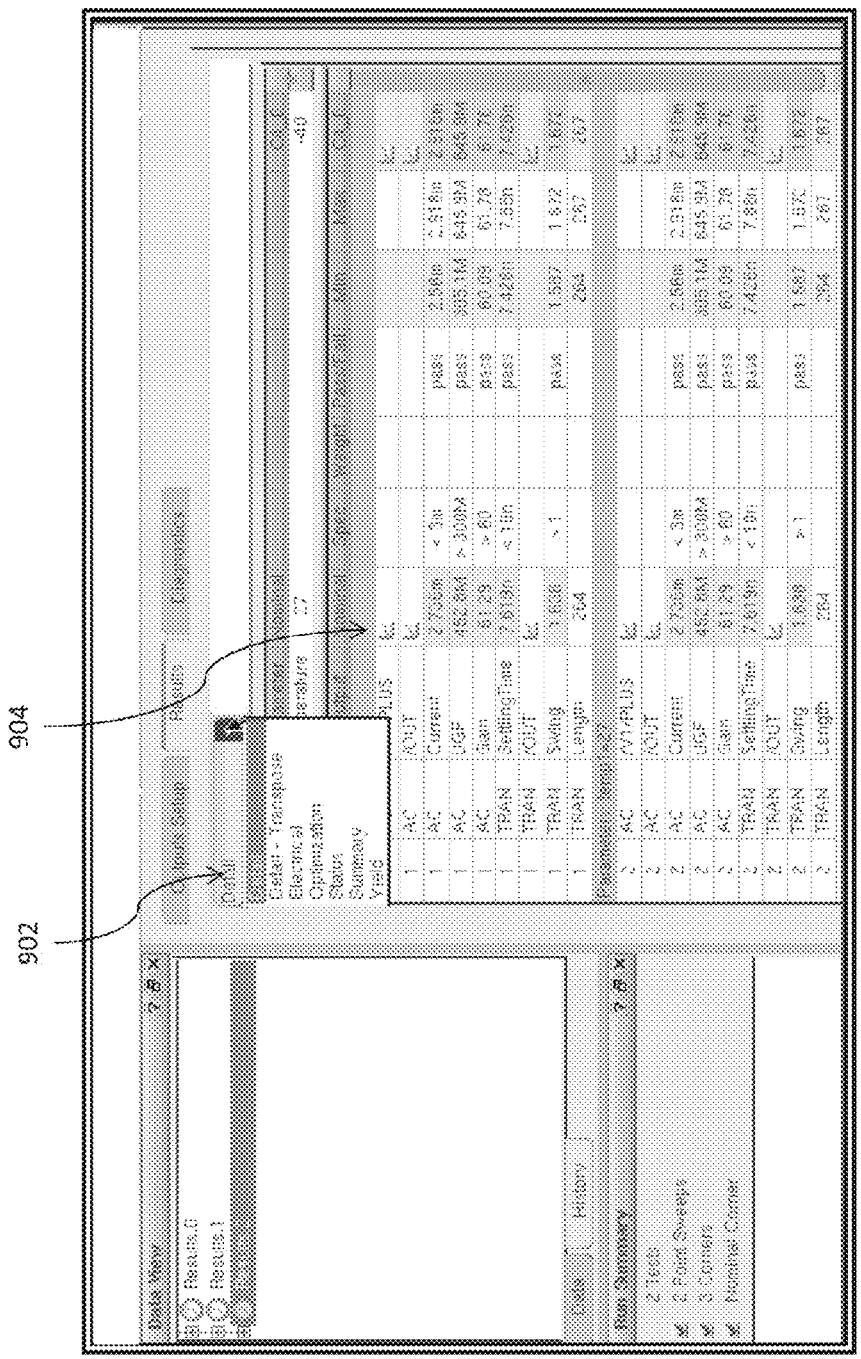
FIG. 9 illustrates a part of an exemplary interface for creating or manipulating electrical data sets for an electronic design in some embodiments.

FIG. 9 illustrates a detail view of an exemplary interface of a design, simulation, verification, and/or optimization electronic design automation tool(s) such as an analog design and simulation tool that provides detailed electrical information or parasitic information for, for example, analyses, verification, optimization, or design exploration of one or more electronic designs. The detail view may be activated by selecting "Detail" 902 from the selector. FIG. 9 further illustrates that the disclosed electrical assistant module provides a user with the capability to switch between view(s) provided by the electrical assistant module and view(s) provided by one or more other electronic design automation design tools. With this capability of switching among views provided by the described electrical assistant module and other views provided by other electronic design automation tools, the waveform display as depicted by the graphic symbol 904 may be launched from within an electrical assistant module session as well as in a, for example, simulation output view generated by a simulation tool.

As it may be seen in the exemplary interface illustrated in FIG. 9, the detail view of the exemplary interface displays the analysis mode(s) ("AC" for "AC analysis" and "TRAN" for "transient analysis"), the output names (e.g., "Current", "Gain", "SettingTime", "Swing", "Length", etc.), the corresponding nominal values (listed under the "Nominal" column), the corresponding values in the design specification (listed under the "Spec" column), whether a given electrical data or information passes or fails to meet the Specification (listed under "Pass/Fail" column), the minimum value(s), the maximum value(s), the process parameter value(s), etc.

Figure 10:
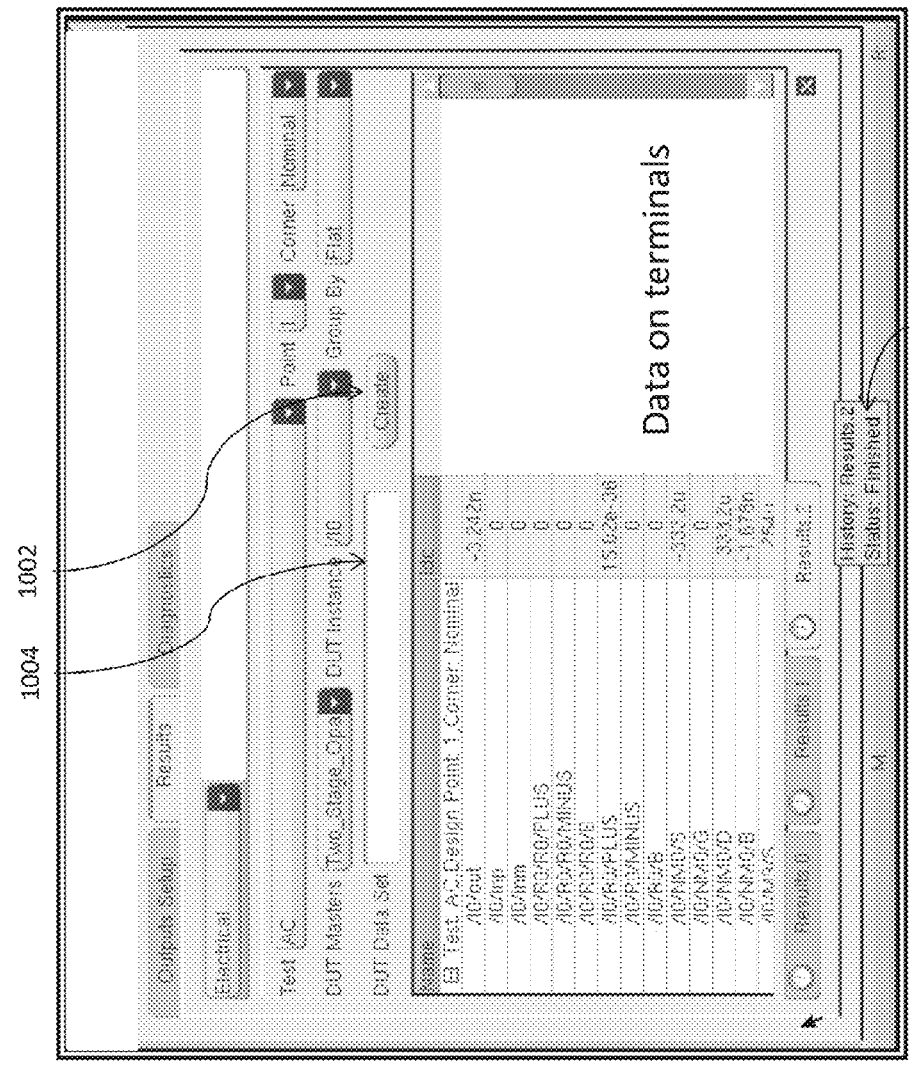
FIG. 10 illustrates a part of an exemplary interface for creating or manipulating electrical data sets for an electronic design in some embodiments.

FIG. 10 illustrates a part of an exemplary interface for creating or manipulating electrical data sets for an electronic design in some embodiments. A user may specify a desired name for the electrical data set to be created in the "DUT Data Set" field 1004 and create the electrical data set with the specified name by clicking on the "Create" button 1002. The pop-up display 1006 shows that the status of the selected simulation or analysis result as "finished" in this example to indicate the analysis or simulation has been completed. In some embodiments where the simulation or analysis is still running, the electrical assistant module displays a partial simulation or analysis result. The data displayed in the exemplary interface illustrated in FIG. 10 represent some electrical data or information on terminals or pins.

Figure 11:
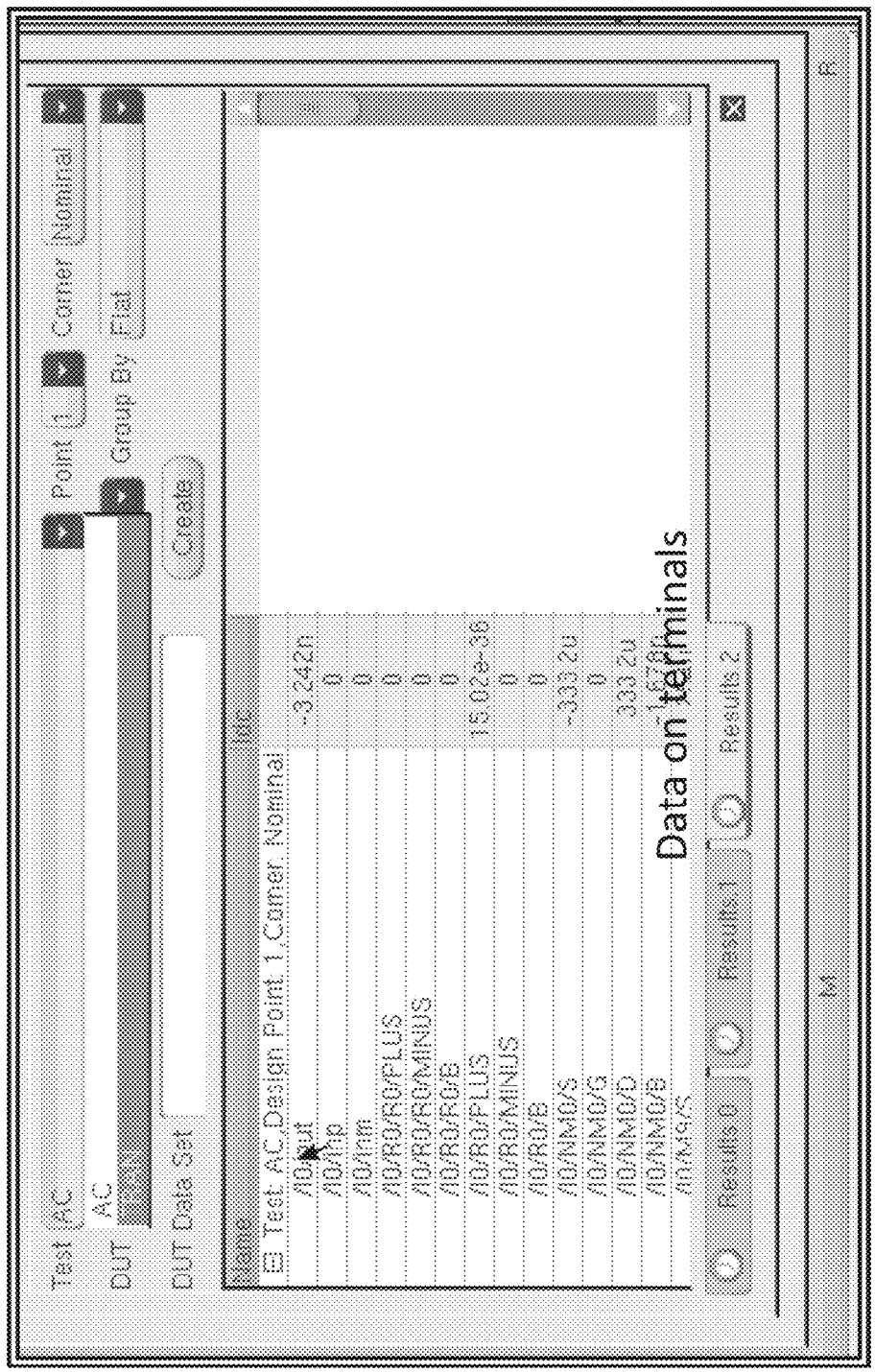
FIG. 11 illustrates a part of an exemplary interface for creating or manipulating electrical data sets for an electronic design in some embodiments.

FIG. 11 illustrates a part of an exemplary interface for creating or manipulating electrical data sets for an electronic design in some embodiments. More specifically, FIG. 11 shows the selection among different types of tests. In this exemplary interface, the "AC" test and the "TRAN" test are listed in the Test selector. Other types of tests or analyses, such as the DC test, may also be available. The display window shows some electrical data or information on the terminals or pins in this exemplary interface illustrated in FIG. 11.

Figure 12:
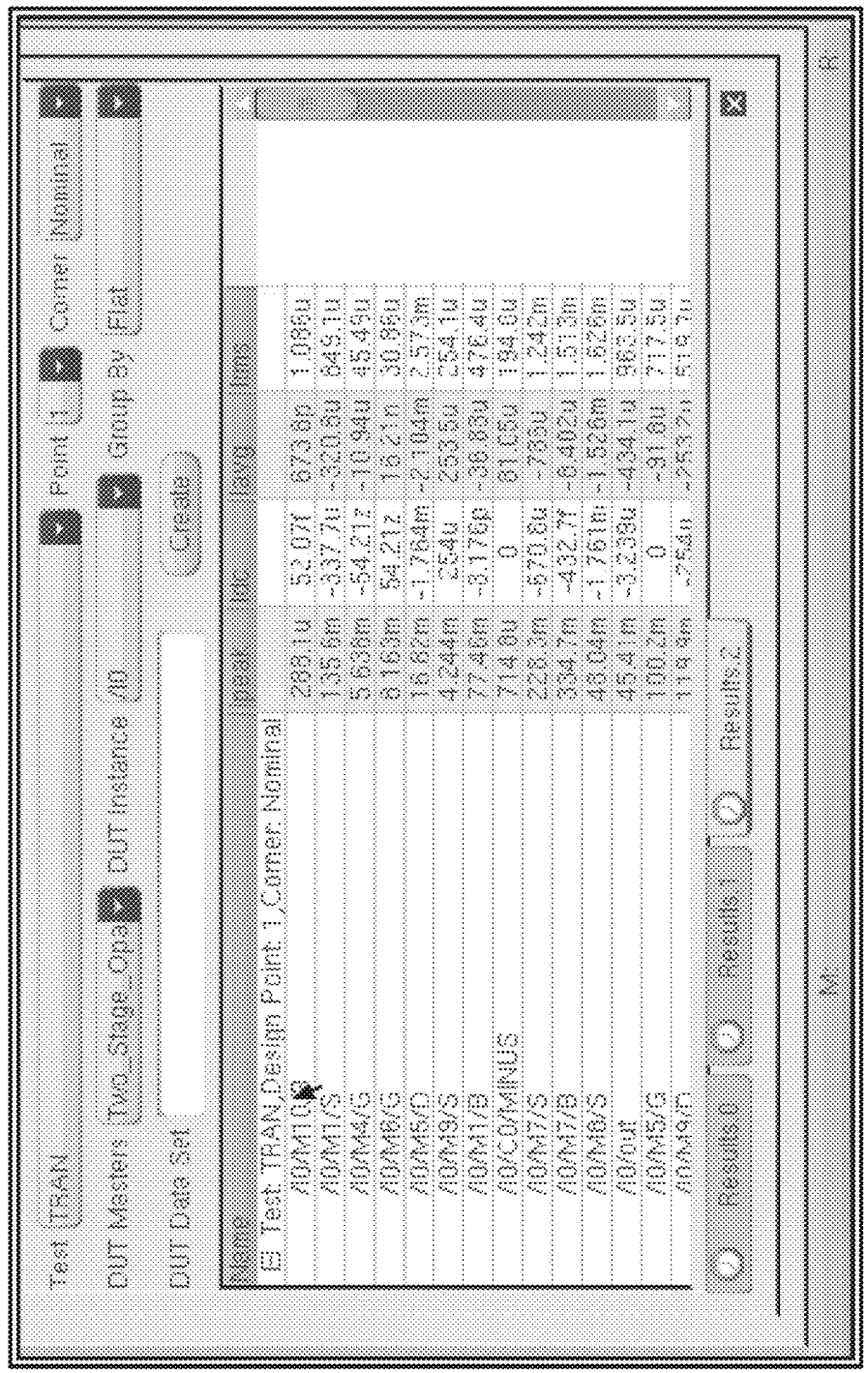
FIG. 12 illustrates a part of an exemplary interface for creating or manipulating electrical data sets for an electronic design in some embodiments.

FIG. 12 illustrates a part of an exemplary interface for creating or manipulating electrical data sets for an electronic design in some embodiments. More specifically, FIG. 12 shows the simulation or analysis results of transient analysis with four exemplary, configurable outputs—Ipeak (peak current), Idc (DC current), Iavg (average current), and Irms (root-mean-square current)—at some terminals—/10/M1/S, /10/M4/G, etc. The electrical assistant module uses its built in logic to compute these currents based on the simulation or analysis result in some embodiments. For example, Iavg is an average of a current fetched from the simulation or analysis of the current. The electrical assistant module provides some basic computations by default. The electrical assistant module is also configurable or extensible by the user to add or remove one or more computation logic or algorithms to the electrical assistant module. The user may also be allowed to enable or disable certain computation logic or define other sets or logic of computations to be performed on the simulation or analysis results obtained from the simulation(s) or analysis(es).

Figure 13:
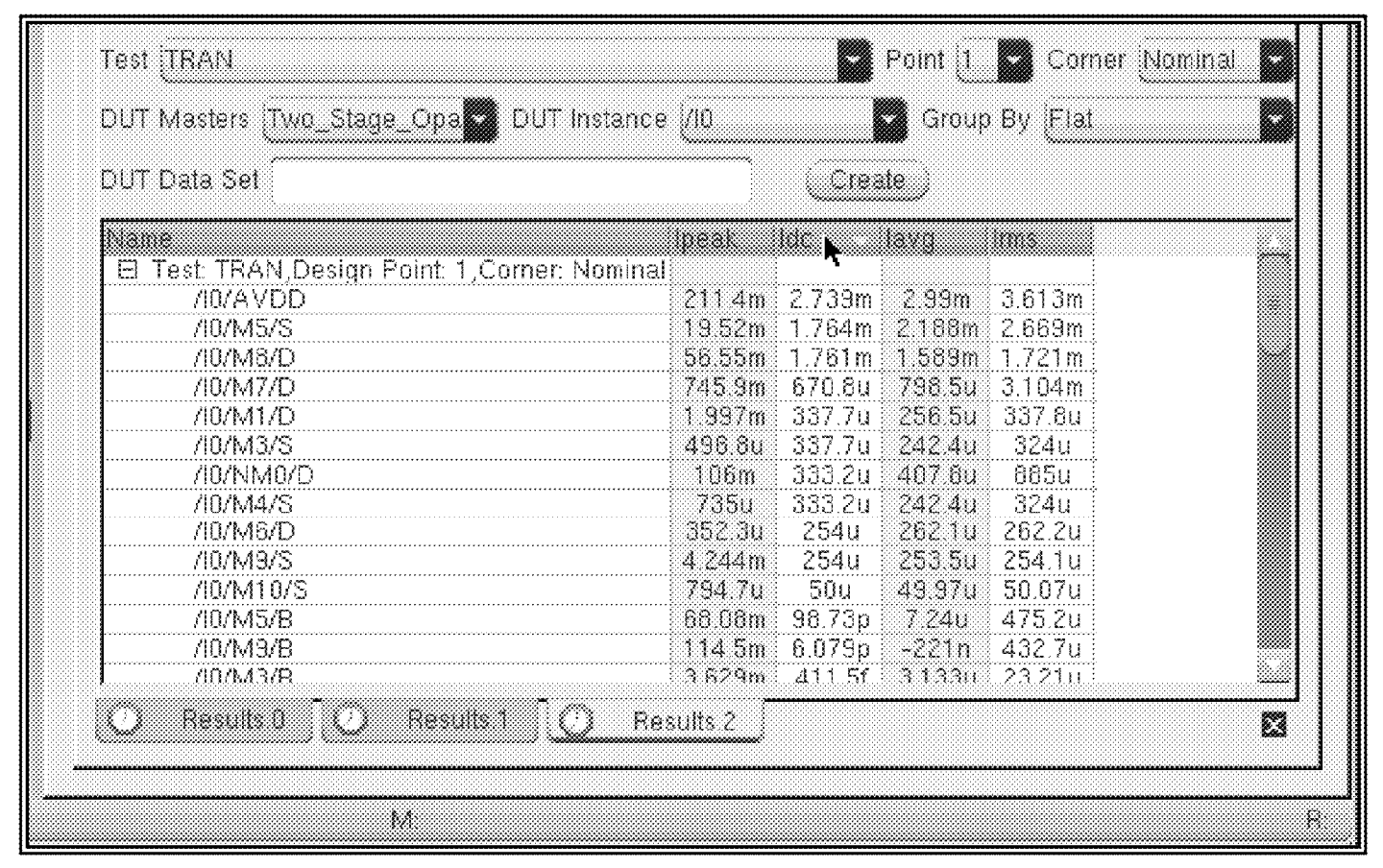

FIG. 13 illustrates a part of an exemplary interface for creating or manipulating electrical data sets for an electronic design in some embodiments. More specifically, FIG. 13 shows Ipeak, Idc, Iavg, and Irms on at least some of the terminals or pins of the selected or identified DUT instance "/10". A user may sort the displayed values in ascending or descending order by clicking on the column title "Ipeak", "Idc", "Iavg", or "Irms". In some embodiments, a user may customize the displayed electrical data or information by adding one or more columns (e.g., Idc for direct current at the terminals, pins, or nodes) or removing one or more columns from the interface. In some embodiments, a user may select by, for example, click on or double click on any terminal or pin on the display interface, and the method or the system may automatically invoke the schematic editor or the layout editor to show the selected terminal or pin and some of its peripheral components.

Figure 14:
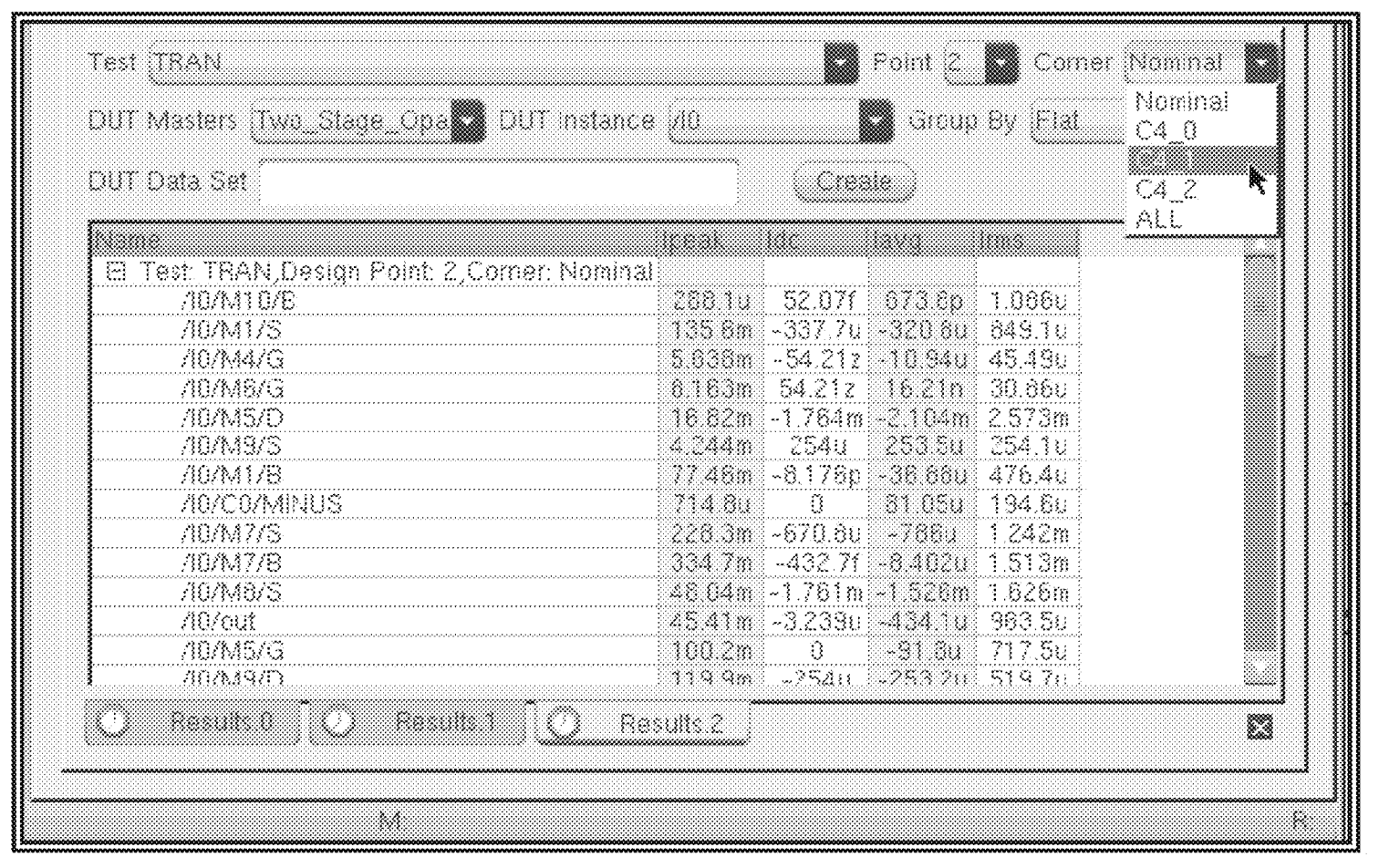

FIG. 14 illustrates a part of an exemplary interface for creating or manipulating electrical data sets for an electronic design in some embodiments. More specifically, FIG. 14 shows the corner case scenarios available for a user to select. As it may be seen from FIG. 14, a user may select a nominal corner case scenario, all corner case scenarios, or any individual corner case scenario. The method or the system may also automatically select a default corner case scenario (e.g., nominal corner or all corners) in the absence of a user's selection of a corner case scenario.

Figure 15:
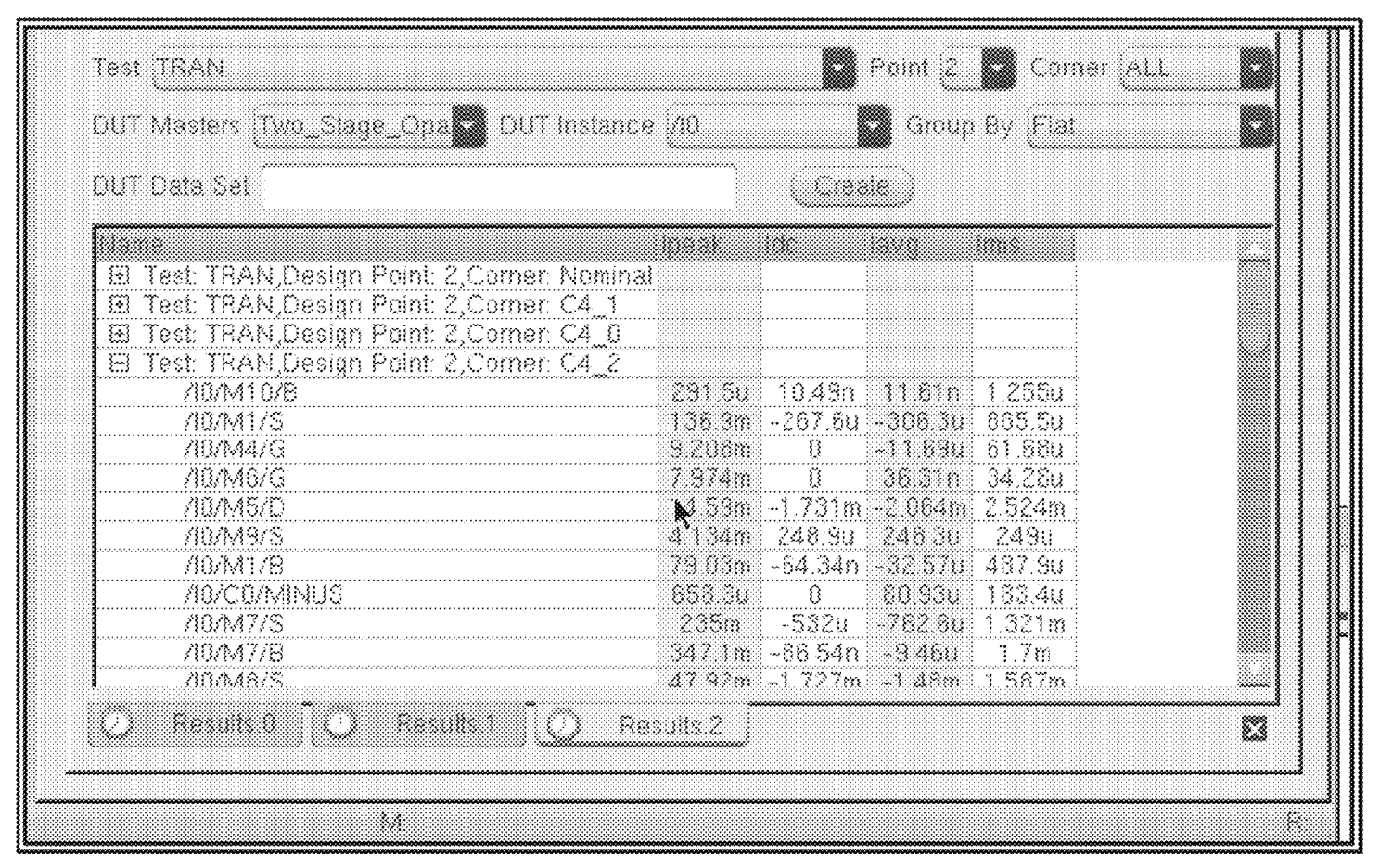

FIG. 15 illustrates a part of an exemplary interface for creating or manipulating electrical data sets for an electronic design in some embodiments. More specifically, this exemplary embodiment shows that all corner case scenarios have been selected, and that the electrical assistant module displays the electrical data or information (Ipeak, Idc, Iavg, Irms) for all the corner case scenarios. In this exemplary embodiment, the corresponding electrical data or information is grouped for each of the corner case scenario in a collapsible manner where the "Nominal", "C4_1", and "C4_0" corner case scenarios are collapsed, while the corner case scenario "C4_2" are expanded to display the Ipeak, Idc, Iavg, Irms data for at least some of the terminals, pins, or nodes for the "/10" DUT instance. In this exemplary embodiment, the method or the system groups the displayed results collapsible display by the corner case scenarios. In some embodiments, the method or the system may also group the displayed results collapsible display may also support multi-level grouping of the display results by having, for example, first level grouping by the terminal names, and the second level grouping by a certain type of electrical data.

Figure 16:
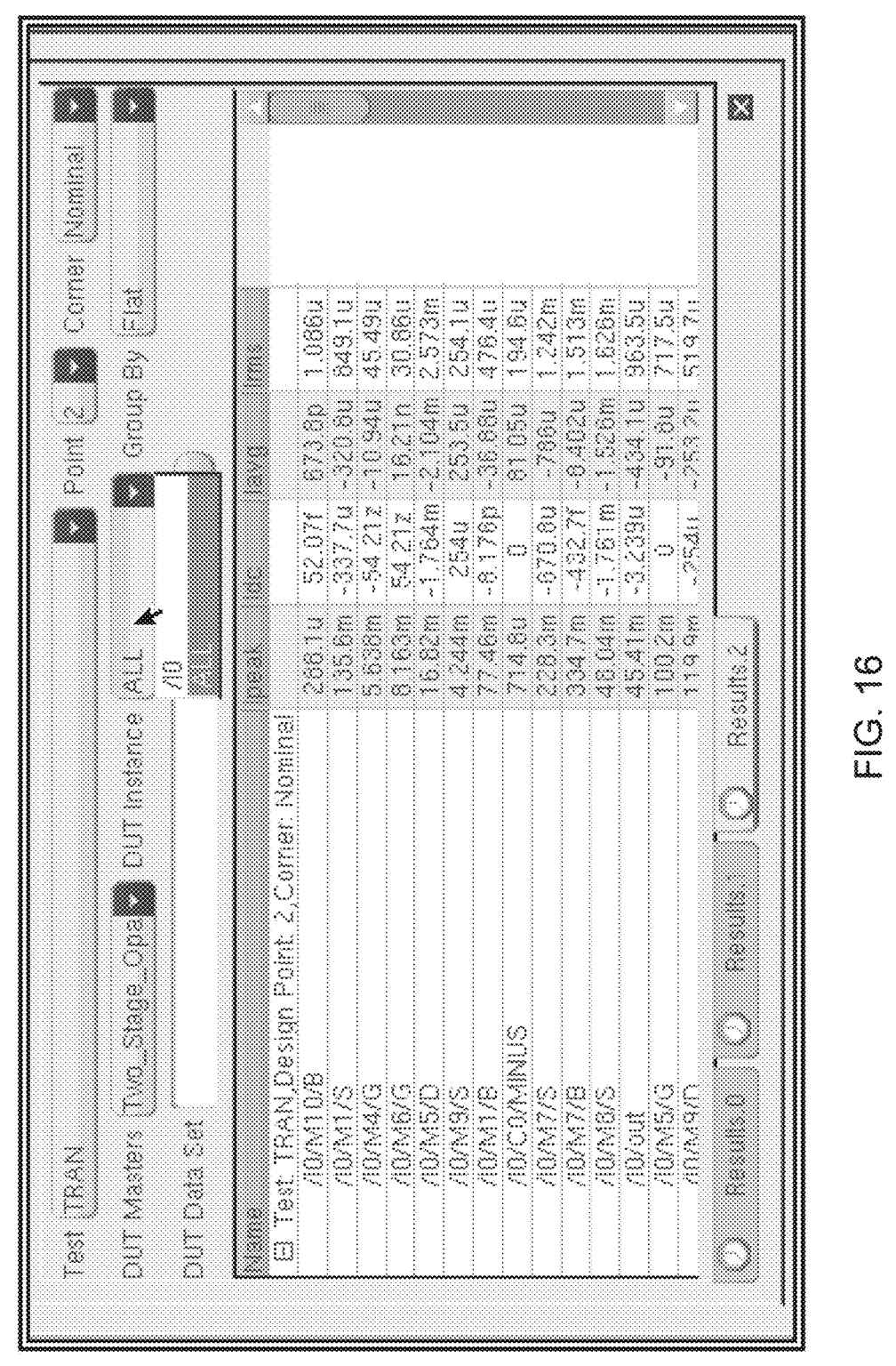

FIG. 16 illustrates a part of an exemplary interface for creating or manipulating electrical data sets for an electronic design in some embodiments. More specifically, FIG. 16 illustrates an exemplary interface showing the selection of DUT instance from the "DUT Instance" selector corresponding to the "DUT Masters". In this exemplary interface, the electrical assistant module offers the DUT instance "/10" (a particular instance) or "ALL" (all instances for the identified DUT master). In some other embodiments, other DUT instances or combinations of DUT instances may also be selected. For example, the method or the system may offer the selection of DUT instances by connectivity information.

Figure 17:
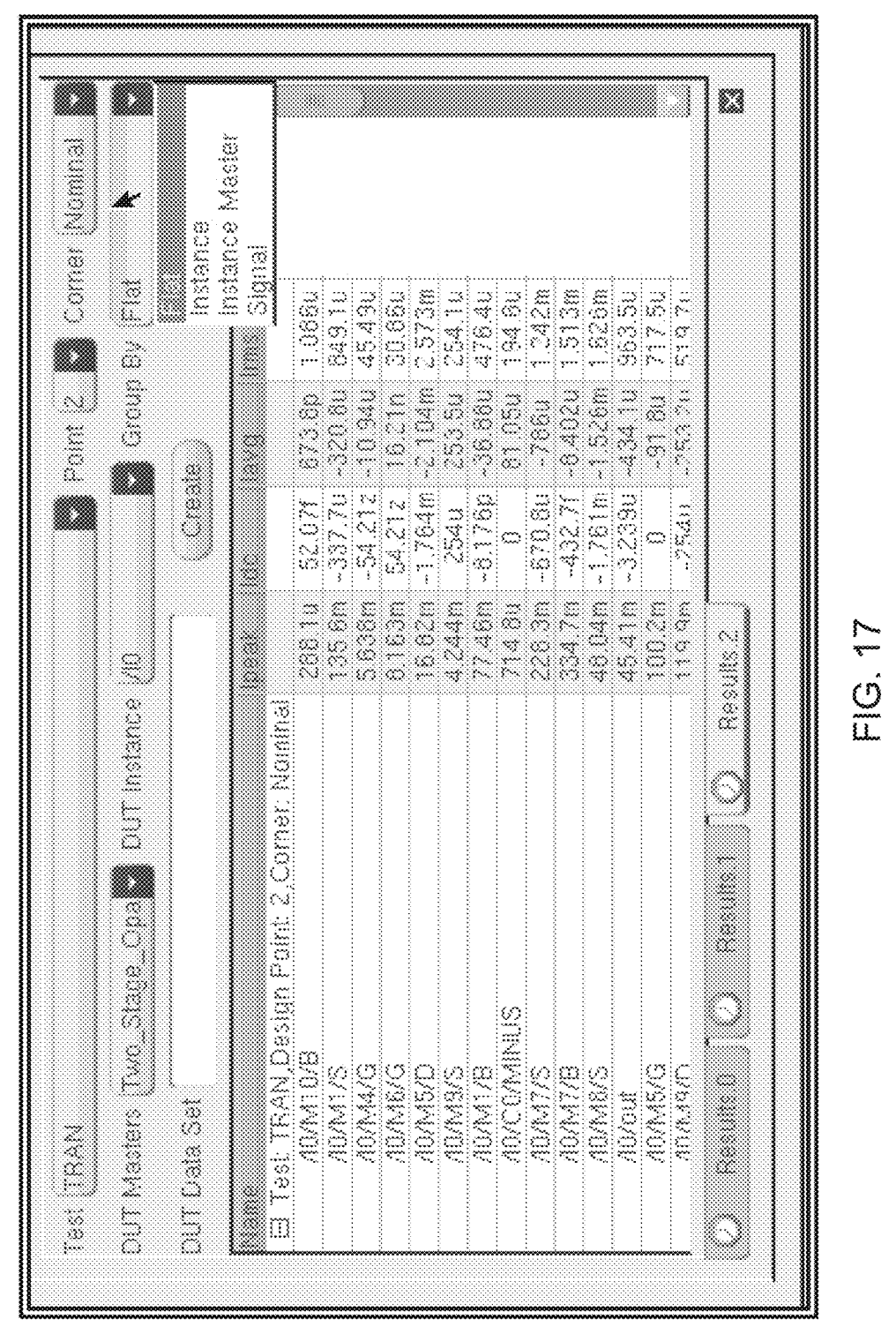

FIG. 17 illustrates a part of an exemplary interface for creating or manipulating electrical data sets for an electronic design in some embodiments. More specifically, FIG. 17 shows the grouping mechanism that provides the options of grouping the display of data or information by "Flat", by "Instance", by "Instance Master", or by "Signal" in some embodiments. In these embodiments, grouping the display data or information by "signal" indicates that the method or the system may group the display data or information according to connectivity or signal paths.

In addition, grouping by "instance" indicates that the method or the system groups the display data or information within the identified DUT instance. In addition, grouping by "instance master" indicates that the method or the system groups the display data or information according to the type of the design and thus shows all the terminals, pins, or nodes associated with the identified or selected DUT master in the "DUT Master" selector. In addition, grouping by "flat" indicates that the method or the system groups the display data or information in a flattened version of the DUT instance or the electronic design.

Figure 18:
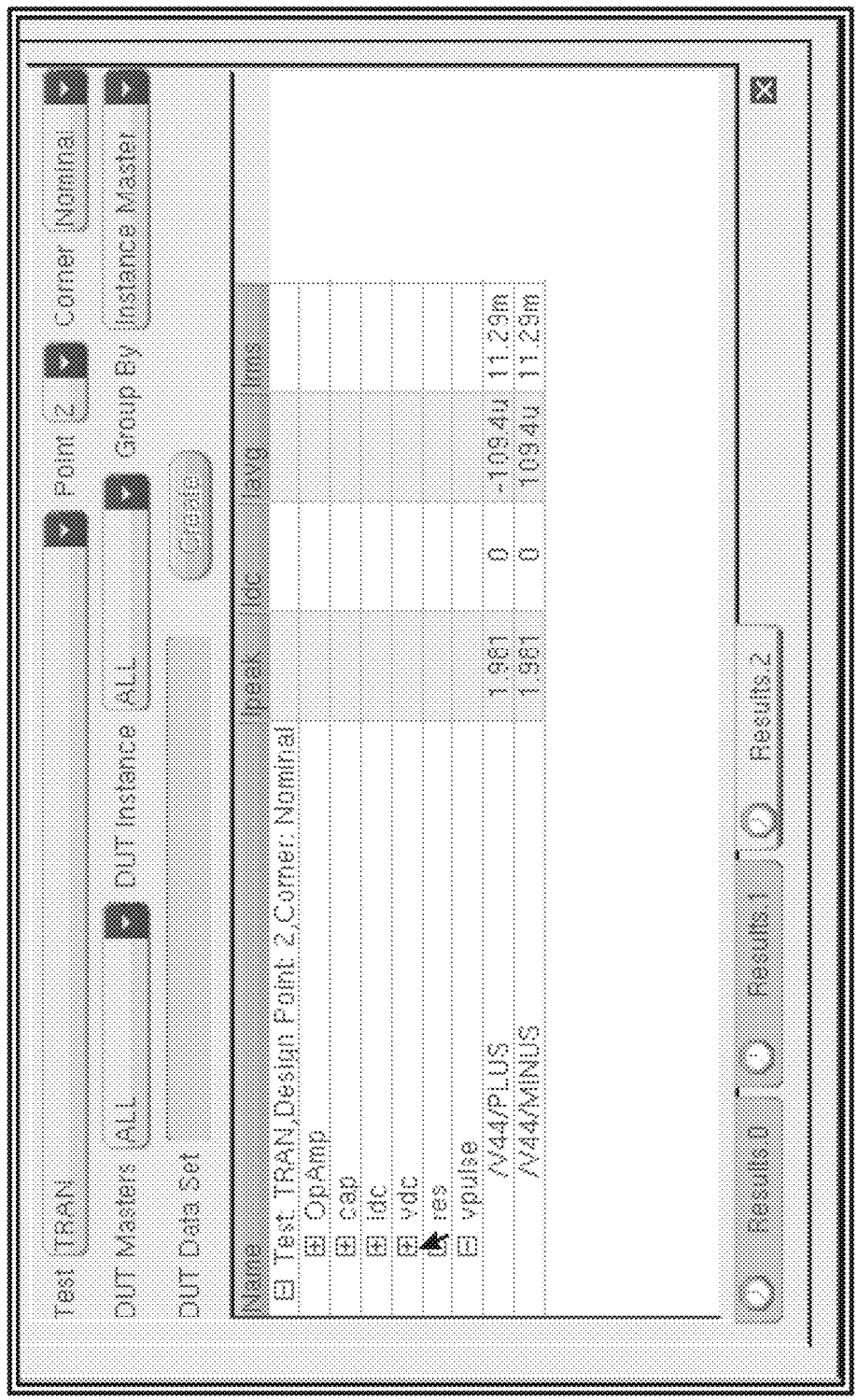
FIG. 18 illustrates a part of an exemplary interface for creating or manipulating electrical data sets for an electronic design in some embodiments.

FIG. 18 illustrates a part of an exemplary interface for creating or manipulating electrical data sets for an electronic design in some embodiments. More specifically, FIG. 18 illustrates terminals grouped by the DUT "Instance Master". In this exemplary embodiment, all DUT masters have been identified or selected in the "DUT Masters" selector. As a result, the display shows the collapsible DUT masters "OpAmp", "cap", "idc", "vdc", "res", and "vpulse", where "vpulse" is expanded to show further detailed electrical data for two terminals grouped by the instance master, while the other DUT masters are collapsed.

Figure 19:
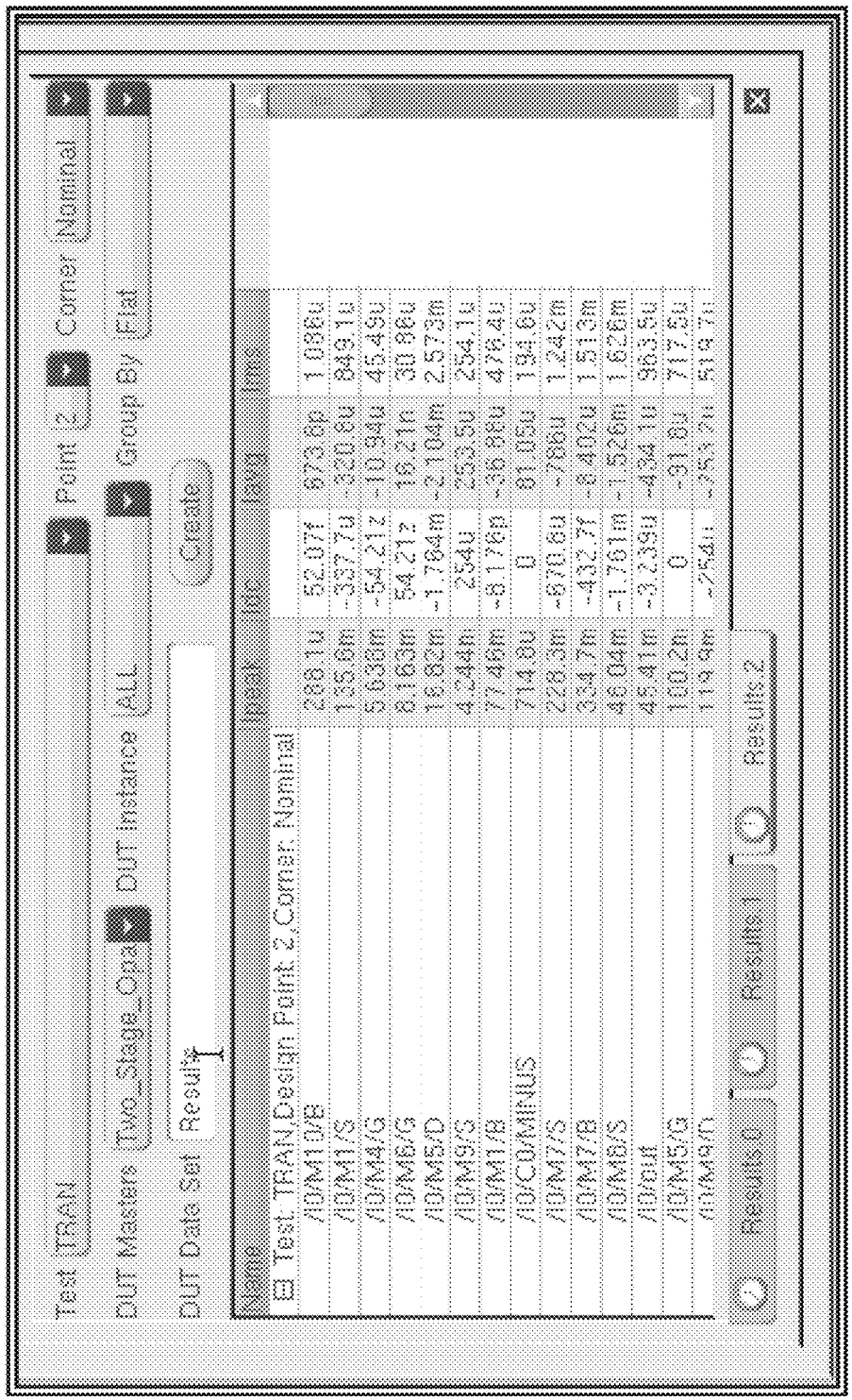
FIG. 19 illustrates a part of an exemplary interface for creating or manipulating electrical data sets for an electronic design in some embodiments.

FIG. 19 illustrates a part of an exemplary interface for creating or manipulating electrical data sets for an electronic design in some embodiments. More specifically, FIG. 19 shows the setup and creation of an electrical data set. In this exemplary embodiment, the name of the electrical data set has been specified as "Results". Once the name of the electrical data set is specified, a user may click on the "Create" button to create the electrical data set, and the method or the system will generate the "Results" electrical data set according to the options (e.g., "DUT Master", "Test", "Point", "Corner", "DUT Instance", "Group By") identified. In some embodiments where the same electrical data set name is specified, the method or the system automatically adds a suffix (e.g., "0.0", "0.1", and "0.2" as illustrated in FIG. 19) to the name of the created electrical data sets to distinguish these electrical data sets with the same specified name from one another.

Figure 20:
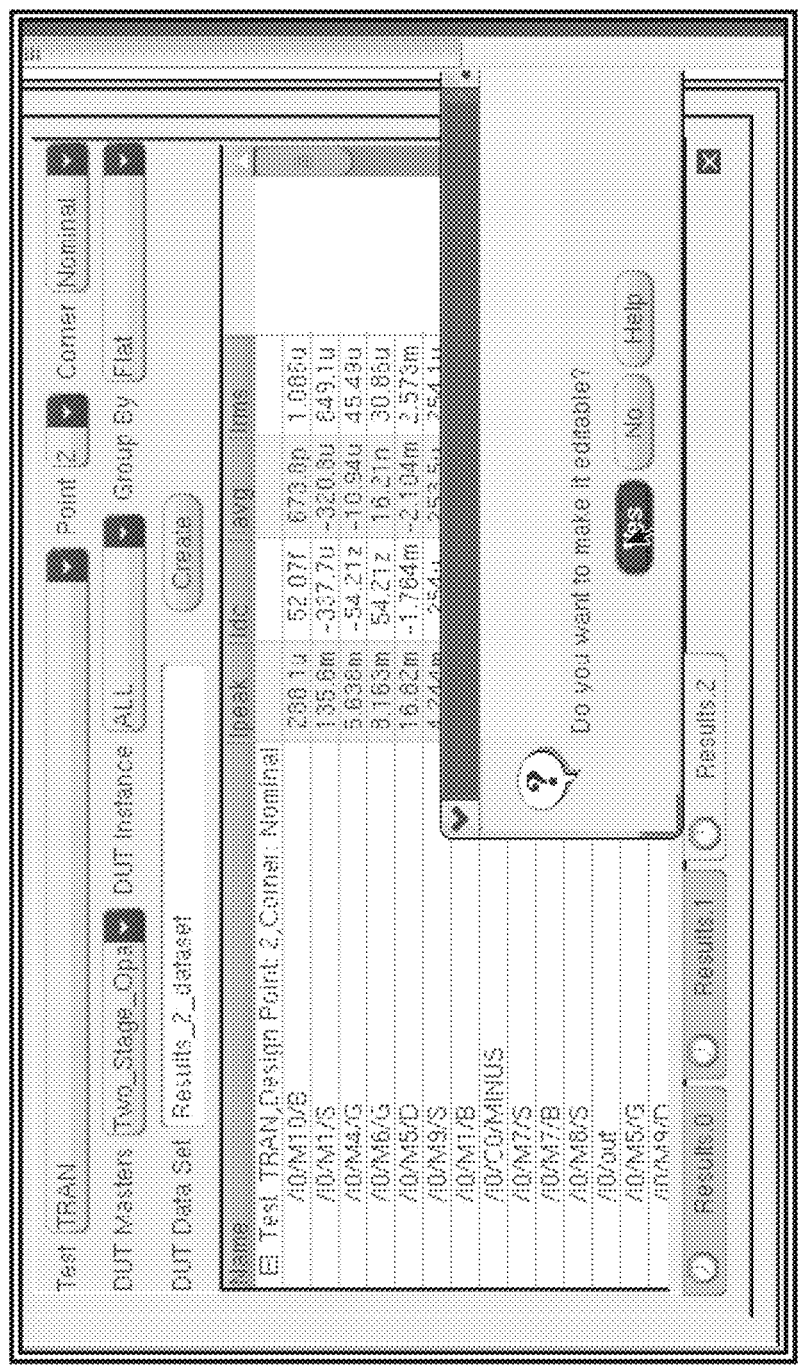
FIG. 20 illustrates a part of an exemplary interface for creating or manipulating electrical data sets for an electronic design in some embodiments.

FIG. 20 illustrates a part of an exemplary interface for creating or manipulating electrical data sets for an electronic design in some embodiments. More specifically, FIG. 20 shows that the method or the system automatically hand off the electrical data or information in the electrical data set "Results_2_dataset" to another abstraction level (e.g., a layout level). In some embodiments, the method or the system may, by default, makes the electrical data set read only while offering an option to the user to override the "read-only" attribute and make the electrical data set editable.

Figure 21:
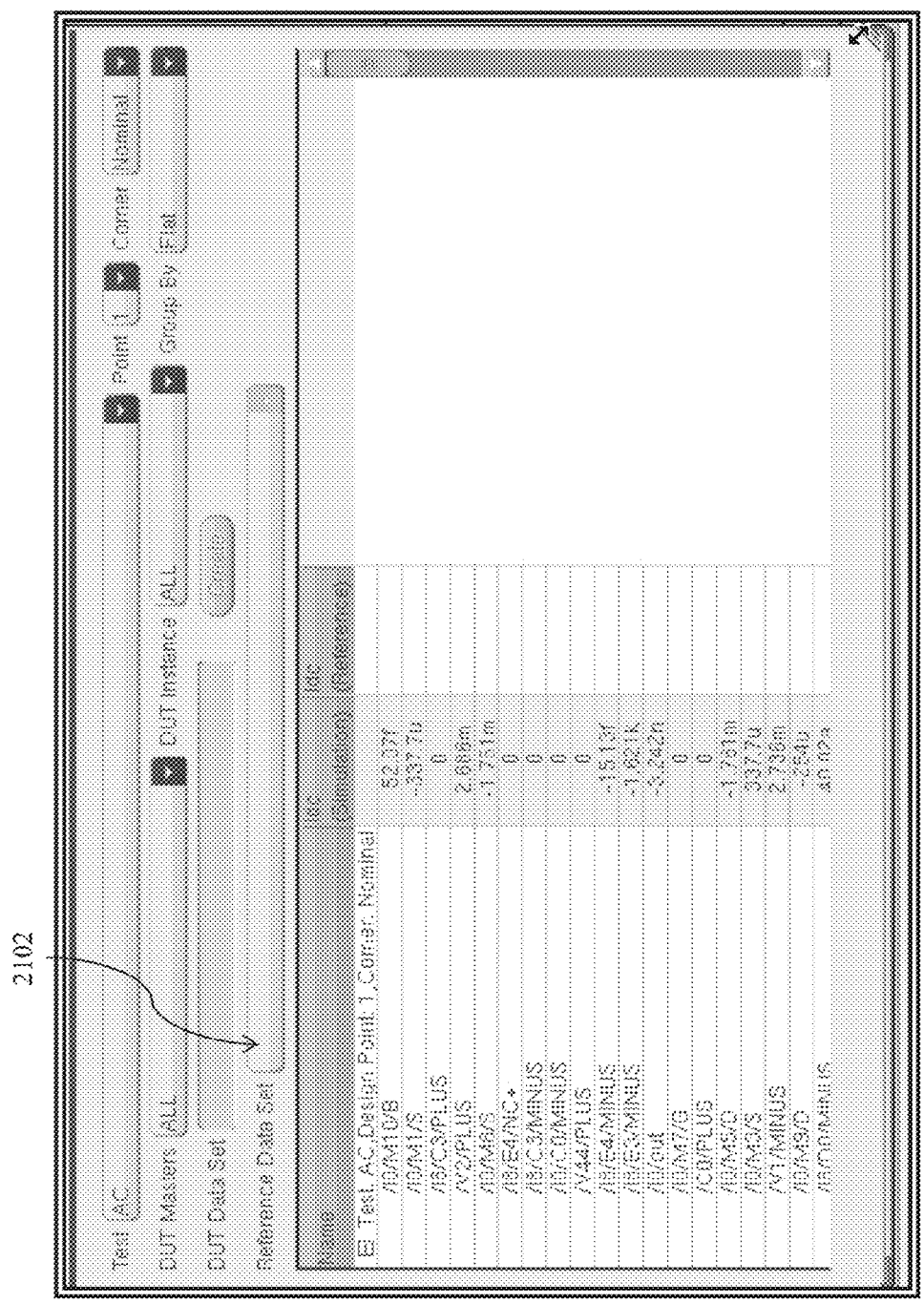
FIG. 21 illustrates a part of an exemplary interface for creating or manipulating electrical data sets for an electronic design in some embodiments.

FIG. 21 illustrates a part of an exemplary interface for creating or manipulating electrical data sets for an electronic design in some embodiments. More specifically, FIG. 21 shows the comparison of an electrical data set with or to another preexisting electrical data set that may be identified in "Reference Data Set" selector 2102. The tabulated data or information displayed in the exemplary embodiment shows the data for the current electrical data set.

Figure 22:
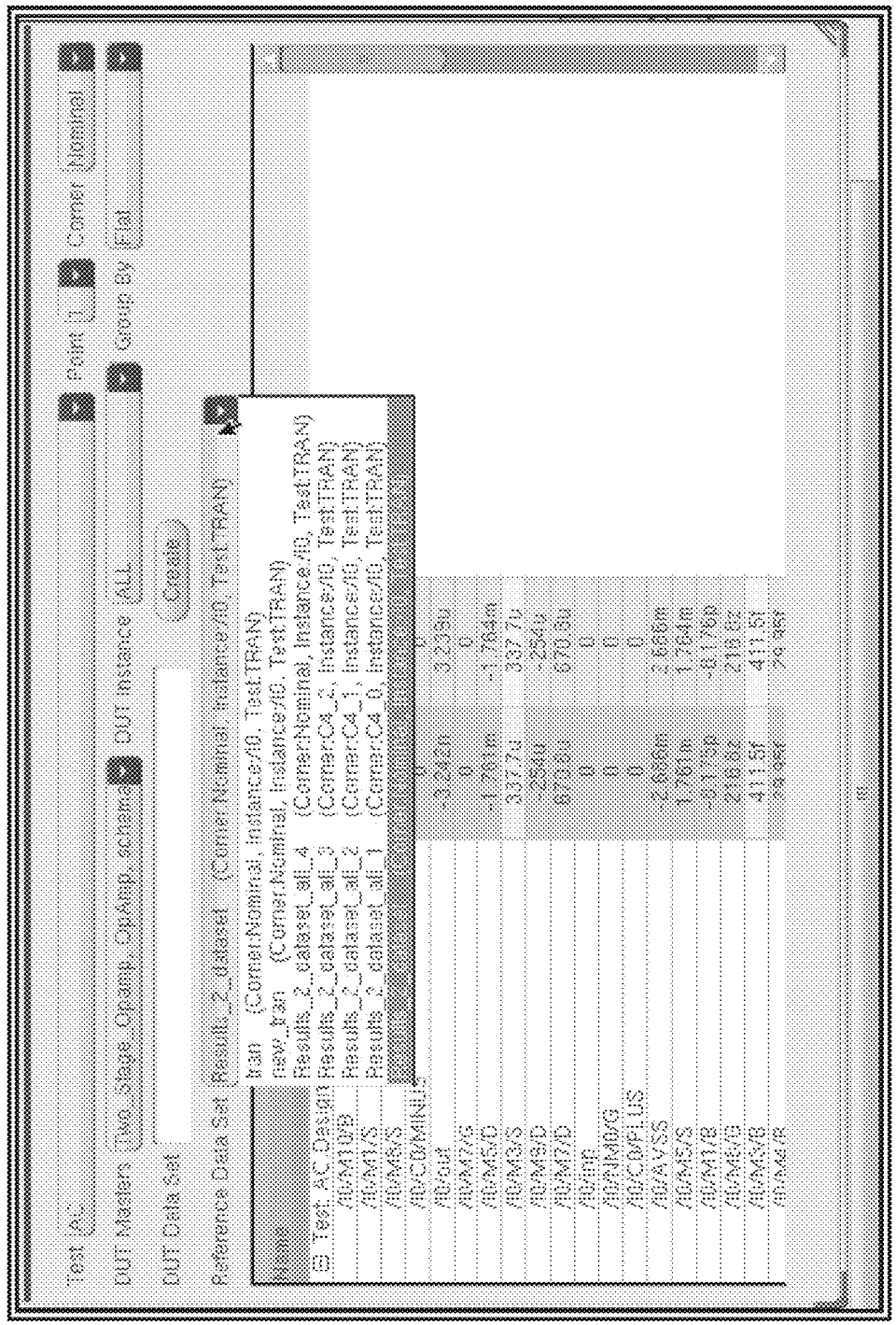
FIG. 22 illustrates a part of an exemplary interface for creating or manipulating electrical data sets for an electronic design in some embodiments.

FIG. 22 illustrates a part of an exemplary interface for creating or manipulating electrical data sets for an electronic design in some embodiments. More specifically, FIG. 22 shows the identification of the one or more preexisting electrical data sets that have been created. FIG. 22 shows two column of data or information in a tabulated form where the two columns correspond to the electrical data set created and the preexisting electrical data set that was previously established. In some embodiments, the method or the system may further use a color coding scheme to provide visual queue of the comparison results. For example, the method or the system may use the green color for the data or information that represents the better of the two or that represents the data or information is within the specification or design limit. The method or the system may also use other colors to indicate whether certain values are beyond the specification or whether one piece of data or information in one electrical data set is greater than (or smaller than) the corresponding piece of data or information in the other electrical data set. In some embodiments, multiple preexisting or reference electrical data sets may be identified for the comparison.

Figure 23:
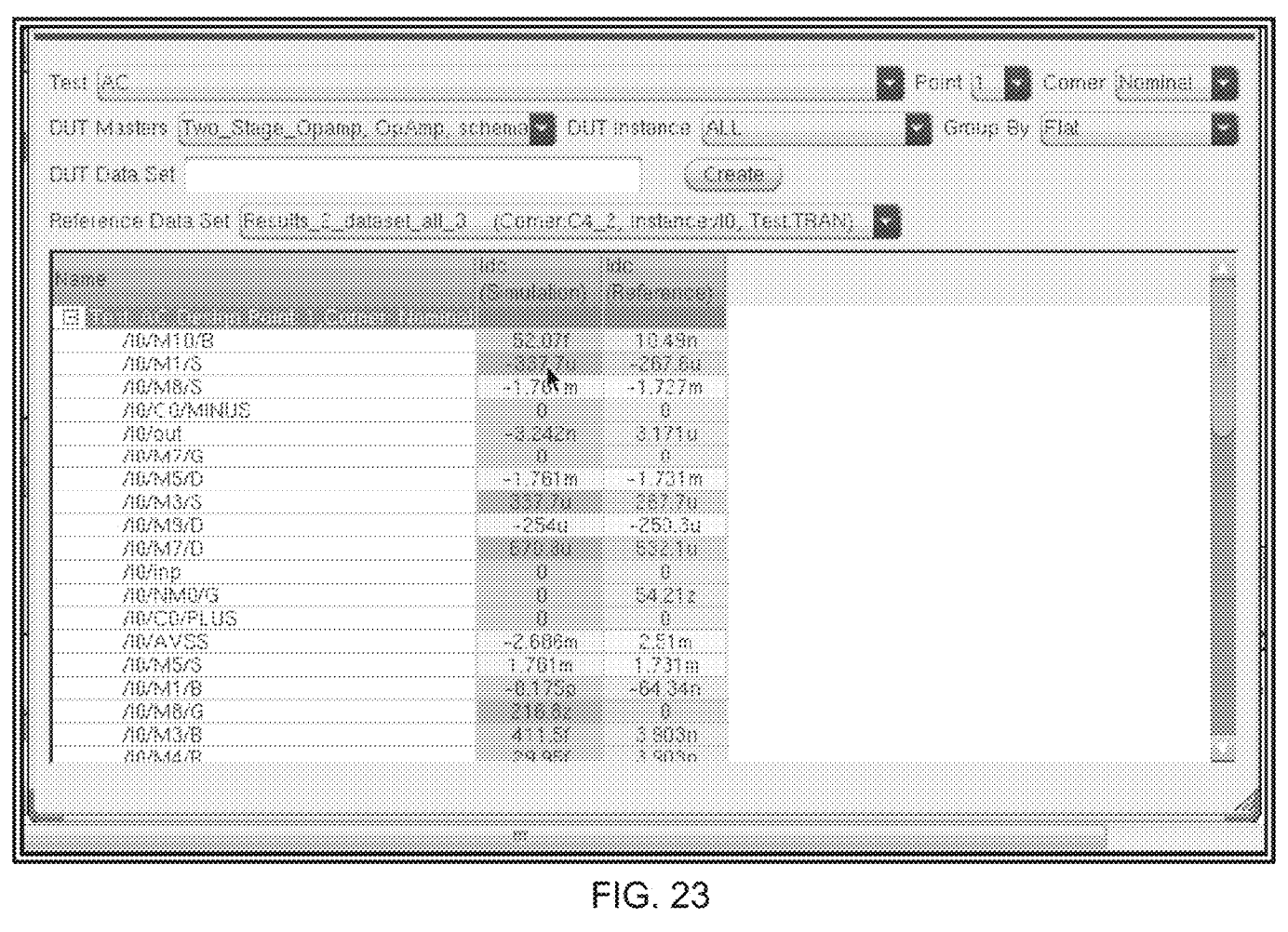

FIG. 23 illustrates a part of an exemplary interface for creating or manipulating electrical data sets for an electronic design in some embodiments. In some embodiments, the method or the system may also use a color coding scheme or a thermal map to provide visual queue for different pieces of data or information. For example, the method or the system may highlight any pieces of data or information in the electrical data set in red if these pieces of data or information exceed the corresponding values in the preexisting or reference electrical data set. Moreover, FIG. 23 shows the comparison of absolute values between an electrical data set and a preexisting electrical data set in some embodiments. That is, the method or the system may use the "-" sign to indicate the direction of the current flow, while the comparison between the two electrical data sets is conducted based on the absolute values of the data or information.

SYSTEM ARCHITECTURE OVERVIEW

Figure 24:
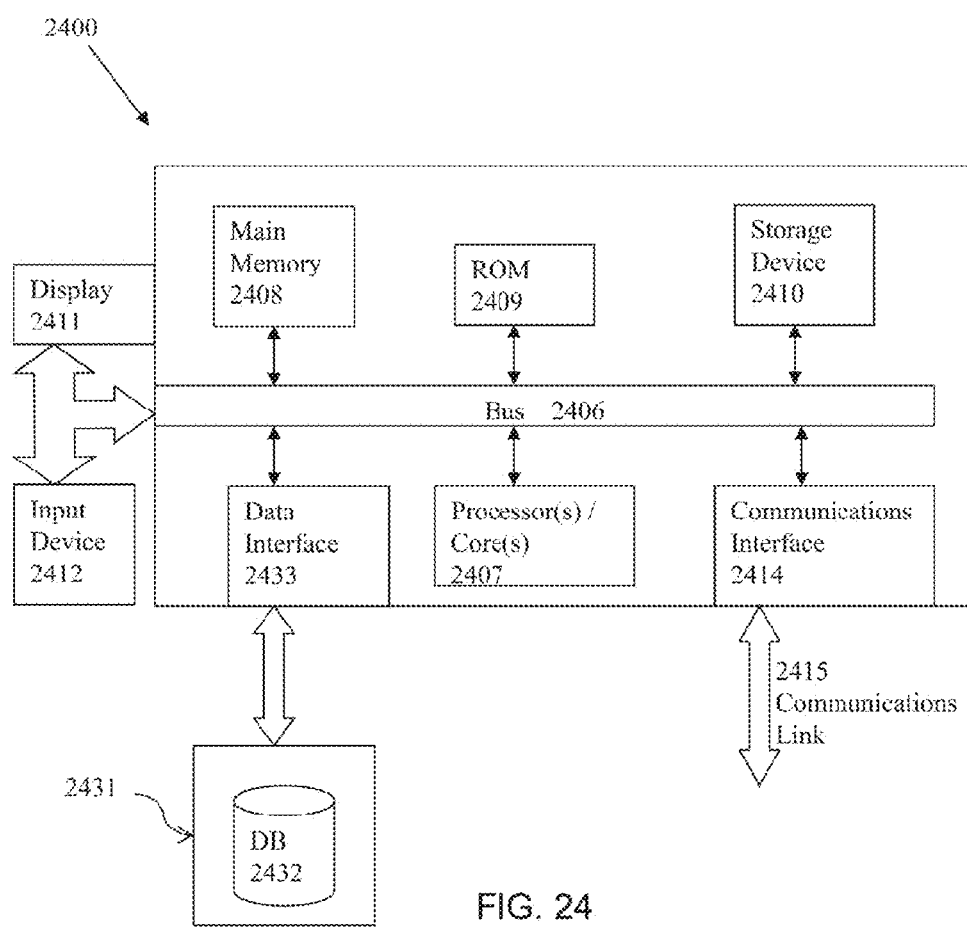
FIG. 24 illustrates a high level flow diagram for evaluating layout dependent effects in an electronic design by using multi-scenario physically-aware design methodology in some embodiments.

FIG. 24 illustrates a block diagram of an illustrative computing system 2400 suitable for implementing some embodiments of the method or system for implementing electronic circuit designs with electro-migration awareness as described in the preceding paragraphs with reference to various figures. Computer system 2400 includes a bus 2406 or other communication mechanism for communicating information, which interconnects subsystems and devices, such as processor 2407, system memory 2408 (e.g., RAM), static storage device 2409 (e.g., ROM), disk drive 2410 (e.g., magnetic or optical), communication interface 2414 (e.g., modem or Ethernet card), display 2411 (e.g., CRT or LCD), input device 2412 (e.g., keyboard), and cursor control (not shown).

According to one embodiment, computer system 2400 performs specific operations by one or more processor or processor cores 2407 executing one or more sequences of one or more instructions contained in system memory 2408. Such instructions may be read into system memory 2408 from another computer readable/usable storage medium, such as static storage device 2409 or disk drive 2410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 2407, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout shapes or nets are created or modified.

The term "computer readable storage medium" or "computer usable storage medium" as used herein refers to any medium that participates in providing instructions to processor 2407 for execution. Such a medium may take many forms, including but not limited to, non-volatile media and volatile media. Non-volatile media includes, for example, optical or magnetic disks, such as disk drive 2410. Volatile media includes dynamic memory, such as system memory 2408.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 2400. According to other embodiments of the invention, two or more computer systems 2400 coupled by communication link 2415 (e.g., LAN, PTSN, or wireless network) may perform the sequence of instructions required to practice the invention in coordination with one another.

Computer system 2400 may transmit and receive messages, data, and instructions, including program, i.e., application code, through communication link 2415 and communication interface 2414. Received program code may be executed by processor 2407 as it is received, and/or stored in disk drive 2410, or other non-volatile storage for later execution. In an embodiment, the computer system 2400 operates in conjunction with a data storage system 2431, e.g., a data storage system 2431 that contains a database 2432 that is readily accessible by the computer system 2400. The computer system 2400 communicates with the data storage system 2431 through a data interface 2433. A data interface 2433, which is coupled to the bus 2406, transmits and receives electrical, electromagnetic or optical signals that include data streams representing various types of signal information, e.g., instructions, messages and data. In embodiments of the invention, the functions of the data interface 2433 may be performed by the communication interface 2414.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for creating or manipulating an electrical data set for an electronic design across multiple abstraction levels, comprising:
   using at least one processor or at least one processor core to perform a process, the process comprising:
   identifying or receiving a simulation result set obtained from a simulation run of at least a part of the electronic design including a first design model for a first component at a first abstraction level;
   identifying relevant data or information from the simulation result set;
   mapping the relevant data or information to a second abstraction level;
   identifying or generating a first electrical data set from the simulation result set at the first abstraction level of the multiple abstraction levels, wherein the first abstraction level includes a schematic design abstraction level and the second abstraction level includes a physical design abstraction level; and
   implementing a second design model of the first component at the second abstraction level using two-way communication between the first abstraction level and the second abstraction level to transmit at least some of the first electrical data set from the simulation result set between the schematic design abstraction level and the physical design abstraction level, wherein the first electrical data set from the first abstraction level hands off to the second abstraction level of the multiple abstraction levels by using a transform between a first abstraction and a second abstraction to map a portion of the first electrical data set to the second abstraction level.

2. The computer implemented method of claim 1, the process further comprising:
   initiating one or more electrical assistant sessions;
   identifying or receiving an input; and
   configuring the simulation result set by using at least the input.

3. The computer implemented method of claim 2, in which the input comprises at least one of a test mode, an analysis mode, a sweep point combination, a parametric sweep of an instance parameter, a corner case scenario, an output setting for the first electrical data set, a performance goal, and a label used to communicate design intent.

4. The computer implemented method of claim 3, in which the analysis mode comprises a direct current analysis, an alternating current analysis, a transient analysis, or a Monte Carlo statistical analysis.

5. The computer implemented method of claim 1, in which the multiple abstraction levels comprise a schematic design level and a physical design level.

6. The computer implemented method of claim 1, in which the simulation run is completed or on going, and the simulation result set comprises a complete set of simulation result or a partial, smaller subset of simulation result of the simulation run.

7. The computer implemented method of claim 1, in which the simulation result set comprises a combination of multiple portions, each of which is obtained from a separate simulation result of a separate simulation run.

8. The computer implemented method of claim 1, the process further comprising:
   identifying one or more design under test instances for a master cell or a master library upon which the simulation run is performed;
   identifying a preexisting electrical data set that was previously established from a prior simulation run for at least a part of the electronic design;
   comparing the electrical data set with the preexisting electrical data set;
   generating a comparison result for the action of comparing the electrical data set with the preexisting electrical data set; and
   applying a color coding scheme to a result of the action of comparing the electrical data set with the preexisting electrical data set, wherein the color coding scheme is used to indicate a relation between the electrical data set and preexisting electrical data set.

9. The computer implemented method of claim 1, the process further comprising:
   identifying or creating a second electrical data set;
   identifying a first portion of the first electrical data set and a second portion of the second electrical data set; and
   combining the first portion and the second portion into combined electrical data or information.

10. The computer implemented method of claim 9, in which the first portion or the second portion comprises data or information for a worst-case analysis.

11. The computer implemented method of claim 9, the process further comprising:
    identifying a portion of the electronic design at the first abstraction level that is associated with the combined electrical data or information; and
    updating at least the portion of the electronic design at the first abstraction level by using at least the combined electrical data or information.

12. The computer implemented method of claim 11, the process further comprising:
    handing off the combined electrical data or information to the second abstraction level, wherein the action of handing off the combined electrical data or information comprises using a mapping between a first abstraction and a second abstraction to transform the combined electrical data or information to the second abstraction level;
    identifying a portion of the electronic design at the second abstraction level that is affected by the combined electrical data or information; and
    updating the portion of the electronic design at the second abstraction level based at least in part upon the combined electrical data or information handed off to the second abstraction level.

13. The computer implemented method of claim 1, the process further comprising:
    updating at least a portion of the electronic design at the second abstraction level based at least in part upon the first electrical data set;
    identifying a first portion of the electronic design at the first abstraction level that is affected by one or more changes in the action of updating at least a portion of the electronic design at the second abstraction level;
    transferring the one or more changes from the second abstraction level to the first abstraction level by using an inverse transform that maps data or information from the second abstraction level to the first abstraction level; and
    updating at least the first portion of the electronic design by using at least the one or more changes that are mapped from the second abstraction level to the first abstraction level.

14. The computer implemented method of claim 1, the process further comprising:
    providing an electrical assistant interface to a user; and
    identifying or receiving a user's input for configuring an output of the action of identifying or generating the first electrical data set or the action of implementing the second design model.

15. The computer implemented method of claim 14, the process further comprising:
    filtering the simulation result or the relevant data or information based at least in part on the user's input; and
    generating the view for the at least some of the first electrical data set based at least in part upon a result of the action of filtering the simulation result or the relevant data or information.

16. The computer implemented method of claim 14, the user's input comprising at least one of a test mode, an identification of analysis mode, an identification of a sweep point combination, an identification of a parametric sweep of an instance parameter, an identification of a corner case scenario, an identification of an output setting for the first electrical data set, a grouping criterion for the view, an identification of one or more design under test instances, an identification of a name of the first electrical data set, an identification of one or more reference electrical data sets, at least one of which comprises a pull-down menu providing one or more available options.

17. The computer implemented method of claim 16, wherein the grouping criterion comprises at least one of grouping by instance master, grouping by a design under test instance, grouping by a signal, and grouping by a flat design.

18. The computer implemented method of claim 15, the process further comprising at least one of:
- sorting the at least some of the first electrical data set in the view by receiving or identifying a user's action or a criterion in the electrical assistant interface;
- applying a color coding scheme to the view, wherein the color coding scheme is used to indicate compliance of at least a part of the electronic circuit design with one or more criteria;
- presenting one or more simulation result sets including the simulation result set in a collapsible form;
- presenting the at least some of the first electrical data set in the view in one or more sortable columns, where each column of the one or more sortable columns comprises data or information for an electrical data set.

19. The computer implemented method of claim 15, in which the electrical assistant interface further comprises a display of a plurality of simulation results, each of which is presented in a collapsible form, and the electrical assistant interface further comprises one or more window tabs, each of which comprises one or more collapsible representations of data or information of a simulation result set created by a simulation run.

20. The computer implemented method of claim 15, in which the electrical assistant interface switches between a first view generated by an electrical assistant module and a second view generated by another electronic design tool and is used to activate an interactive graphic display symbol to launch a waveform display of one or more signals.

21. A system for creating or manipulating an electrical data set for an electronic design across multiple abstraction levels, comprising:
  at least one processor or at least one processor core that is to:
    identify or receive a simulation result set obtained from a simulation run of at least a part of the electronic design including a first design model for a first component at a first abstraction level;
    identify relevant data or information from the simulation result set;
    map the relevant data or information from the simulation result set obtained from the simulation run to a second abstraction level;
    identify or generate a first electrical data set from the simulation result set at the first abstraction level of the multiple abstraction levels, wherein the first abstraction level includes a schematic design abstraction level and the second abstraction level includes a physical design abstraction level; and
    implement a second design model of the first component at the second abstraction level using two-way communication between the first abstraction level and the second abstraction level to transmit at least some of the first electrical data set from the simulation result set between the schematic design abstraction level and the physical design abstraction level, wherein the first electrical data set from the first abstraction level hands off to the second abstraction level of the multiple abstraction levels by using a transform between a first abstraction and a second abstraction to map a portion of the first electrical data set to the second abstraction level.

22. The system of claim 21, in which the at least one processor or at least one processor core is further to:
  initiate one or more electrical assistant sessions;
  identify or receiving an input; and
  configure the simulation result set by using at least the input.

23. The system of claim 21, in which the at least one processor or the at least one processor core is further to:
  identify one or more design under test instances for a master cell or a master library upon which the simulation run is performed;
  identify a preexisting electrical data set that was previously established from a prior simulation run for at least a part of the electronic design;
  compare the electrical data set with the preexisting electrical data set; and
  generate a comparison result for the action of comparing the electrical data set with the preexisting electrical data set.

24. The system of claim 21, in which the at least one processor or the at least one processor core is further to:
  identify or create a second electrical data set;
  identify a first portion of the first electrical data set and a second portion of the second electrical data set; and
  combine the first portion and the second portion into combined electrical data or information.

25. The system of claim 24, in which the at least one processor or the at least one processor core is further to:
  identify a portion of the electronic design at the first abstraction level that is associated with the combined electrical data or information;
  update at least the portion of the electronic design at the first abstraction level by using at least the combined electrical data or information;
  hand off the combined electrical data or information to the second abstraction level by using at least a mapping between a first abstraction and a second abstraction to transform the combined electrical data or information to the second abstraction level;
  identify a portion of the electronic design at the second abstraction level that is affected by the combined electrical data or information; and
  update the portion of the electronic design at the second abstraction level based at least in part upon the combined electrical data or information handed off to the second abstraction level.

26. The system of claim 21, in which the at least one processor or the at least one processor core is further to:
  update at least a portion of the electronic design at the second abstraction level based at least in part upon the first electrical data set;
  identify a first portion of the electronic design at the first abstraction level that is affected by one or more changes in the action of updating at least a portion of the electronic design at the second abstraction level;
  transfer the one or more changes from the second abstraction level to the first abstraction level by using an inverse transform that maps data or information from the second abstraction level to the first abstraction level; and
  update at least the first portion of the electronic design by using at least the one or more changes that are mapped from the second abstraction level to the first abstraction level.

27. The system of claim 21, in which the at least one processor or the at least one processor core is further to:
  provide an electrical assistant interface to a user;
  identify or receiving a user's input for configuring an output of the action of identifying or generating the first electrical data set or the action of implementing the second design model at the second abstraction level;
  filter the simulation result or the relevant data or information based at least in part on the user's input; and generate the view for the at least some of the first electrical data set based at least in part upon a result of the action of filtering the simulation result or the relevant data or information.

28. The system of claim 27, in which the at least one processor or the at least one processor core is further to:
sort the at least some of the first electrical data set in the view by receiving or identifying a user's action or a criterion in the electrical assistant interface;
apply a color coding scheme to the view, wherein the color coding scheme is used to indicate compliance of at least a part of the electronic circuit design with one or more criteria;
present one or more simulation result sets including the simulation result set in a collapsible form; or
present the at least some of the first electrical data set in the view in one or more sortable columns, where each column of the one or more sortable columns comprises data or information for an electrical data set.

29. The system of claim 27, wherein
the user's input comprises at least one of a test mode, an identification of analysis mode, an identification of a sweep point combination, an identification of a parametric sweep of an instance parameter, an identification of a corner case scenario, an identification of an output setting for the first electrical data set, a grouping criterion for the view, an identification of one or more design under test instances, an identification of a name of the first electrical data set, an identification of one or more reference electrical data sets, at least one of which comprises a pull-down menu providing one or more available options, and
the grouping criterion comprises at least one of grouping by instance mater, grouping by a design under test instance, grouping by a signal, and grouping by a flat design.

30. An article of manufacture comprising a non-transitory computer readable storage medium having a sequence of instructions stored thereupon which, when executed by at least one processor or at least one processor core, causes the at least one processor or the at least one processor core to perform a method for creating or manipulating an electrical data set for an electronic design across multiple abstraction levels, the method comprising:
identifying or receive a simulation result set obtained from a simulation run of at least a part of the electronic design including a first design model for a first component at a first abstraction level;
identifying relevant data or information from the simulation result set;
mapping the relevant data or information to a second abstraction level;
identifying or generating a first electrical data set from the simulation result set at the first abstraction level of the multiple abstraction levels, wherein the first abstraction level includes a schematic design abstraction level and the second abstraction level includes a physical design abstraction level; and
implementing a second design model of the first component at the second abstraction level using two-way communication between the first abstraction level and the second abstraction level to transmit at least some of the first electrical data set from the simulation result set between the schematic design abstraction level and the physical design abstraction level, wherein the first electrical data set from the first abstraction level hands off to the second abstraction level of the multiple abstraction levels by using a transform between a first abstraction and a second abstraction to map a portion of the first electrical data set to the second abstraction level.

31. The article of manufacture of claim 30, the process further comprising:
initiating one or more electrical assistant sessions;
identifying or receiving an input; and
configuring the simulation result set by using at least the input.

32. The article of manufacture of claim 30, the process further comprising:
identifying one or more design under test instances for a master cell or a master library upon which the simulation run is performed;
identifying a preexisting electrical data set that was previously established from a prior simulation run for at least a part of the electronic design;
comparing the electrical data set with the preexisting electrical data set; and
generating a comparison result for the action of comparing the electrical data set with the preexisting electrical data set.

33. The article of manufacture of claim 30, the process further comprising:
identifying or create a second electrical data set;
identifying a first portion of the first electrical data set and a second portion of the second electrical data set; and
combining the first portion and the second portion into combined electrical data or information.

34. The article of manufacture of claim 33, the process further comprising:
identifying a portion of the electronic design at the first abstraction level that is associated with the combined electrical data or information;
updating at least the portion of the electronic design at the first abstraction level by using at least the combined electrical data or information;
handing off the combined electrical data or information to the second abstraction level, wherein the action for handing off the combined electrical data or information comprises:
using a mapping between a first abstraction and a second abstraction to transform the combined electrical data or information to the second abstraction level,
identifying a portion of the electronic design at the second abstraction level that is affected by the combined electrical data or information; and
updating the portion of the electronic design at the second abstraction level based at least in part upon the combined electrical data or information handed off to the second abstraction level.

35. The article of manufacture of claim 30, the process further comprising:
updating at least a portion of the electronic design at the second abstraction level based at least in part upon the first electrical data set;
identifying a first portion of the electronic design at the first abstraction level that is affected by one or more changes in the action of updating at least a portion of the electronic design at the second abstraction level;
transferring the one or more changes from the second abstraction level to the first abstraction level by using an inverse transform that maps data or information from the second abstraction level to the first abstraction level; and updating at least the first portion of the electronic design by using at least the one or more changes that are mapped from the second abstraction level to the first abstraction level.

36. The article of manufacture of claim 30, the process further comprising:

providing an electrical assistant interface to a user;

identifying or receiving a user's input for configuring an output of the action of identifying or generating the first electrical data set or the action of implementing the second design model at the second abstraction level;

filtering the simulation result or the relevant data or information based at least in part on the user's input; and generating the view for the at least some of the first electrical data set based at least in part upon a result of the action of filtering the simulation result or the relevant data or information.

37. The article of manufacture of claim 36, the process further comprising:

sorting the at least some of the first electrical data set in the view by receiving or identifying a user's action or a criterion in the electrical assistant interface;

applying a color coding scheme to the view, wherein the color coding scheme is used to indicate compliance of at least a part of the electronic circuit design with one or more criteria;

presenting one or more simulation result sets including the simulation result set in a collapsible form; or presenting the at least some of the first electrical data set in the view in one or more sortable columns, where each column of the one or more sortable columns comprises data or information for an electrical data set.

38. The article of manufacture of claim 36, wherein the user's input comprises at least one of a test mode, an identification of analysis mode, an identification of a sweep point combination, an identification of a parametric sweep of an instance parameter, an identification of a corner case scenario, an identification of an output setting for the first electrical data set, a grouping criterion for the view, an identification of one or more design under test instances, an identification of a name of the first electrical data set, an identification of one or more reference electrical data sets, at least one of which comprises a pull-down menu providing one or more available options, and the grouping criterion comprises at least one of grouping by instance mater, grouping by a design under test instance, grouping by a signal, and grouping by a flat design.

* * * * *